(12) United States Patent
Kondakov et al.

(10) Patent No.: US 9,666,826 B2
(45) Date of Patent: May 30, 2017

(54) ELECTROLUMINESCENT DEVICE INCLUDING AN ANTHRACENE DERIVATIVE

(75) Inventors: Denis Y. Kondakov, Kendall, NY (US); Scott R. Conley, Rochester, NY (US); Kevin P. Klubek, West Henrietta, NY (US)

(73) Assignee: Global OLED Technology LLC, Herndon, VA (US)

( * ) Notice: Subject to any disclaimer, the term of this patent is extended or adjusted under 35 U.S.C. 154(b) by 1155 days.

(21) Appl. No.: 11/412,676

(22) Filed: Apr. 27, 2006

(65) Prior Publication Data

US 2007/0252522 A1 Nov. 1, 2007

(51) Int. Cl.
*H01L 51/54* (2006.01)
*H01L 51/50* (2006.01)
*H01L 51/00* (2006.01)

(52) U.S. Cl.
CPC ...... *H01L 51/5092* (2013.01); *H01L 51/0052* (2013.01); *H01L 51/0058* (2013.01); *H01L 51/0072* (2013.01); *H01L 51/5048* (2013.01); *H01L 51/008* (2013.01); *H01L 51/0059* (2013.01); *H01L 51/0081* (2013.01); *H01L 2251/308* (2013.01); *H01L 2251/558* (2013.01)

(58) Field of Classification Search
USPC ............................................. 428/690
See application file for complete search history.

(56) References Cited

U.S. PATENT DOCUMENTS

| | | |
|---|---|---|
| 3,172,862 A | 3/1965 | Gurnee et al. |
| 3,173,050 A | 3/1965 | Gurnee |
| 3,180,730 A | 4/1965 | Klupfel et al. |
| 3,567,450 A | 3/1971 | Brantly et al. |
| 3,658,520 A | 4/1972 | Brantly et al. |
| 3,710,167 A | 1/1973 | Dresner |
| 4,356,429 A | 10/1982 | Tang |
| 4,539,507 A | 9/1985 | Vanslyke et al. |
| 4,720,432 A | 1/1988 | Vanslyke et al. |
| 4,769,292 A | 9/1988 | Tang et al. |
| 4,885,211 A | 12/1989 | Tang et al. |
| 4,885,221 A | 12/1989 | Tsuneeda et al. |
| 5,059,861 A | 10/1991 | Littman et al. |
| 5,059,862 A | 10/1991 | Vanslyke et al. |
| 5,061,569 A | 10/1991 | Vanslyke et al. |
| 5,121,029 A | 6/1992 | Hosokawa et al. |
| 5,141,671 A | 8/1992 | Bryan et al. |
| 5,150,006 A | 9/1992 | Van Slyke et al. |
| 5,151,629 A | 9/1992 | Van Slyke et al. |
| 5,247,190 A | 9/1993 | Friend et al. |
| 5,276,380 A | 1/1994 | Tang |
| 5,283,182 A | 2/1994 | Powell et al. |
| 5,294,870 A | 3/1994 | Tang et al. |
| 5,405,709 A | 4/1995 | Littman et al. |
| 5,409,783 A | 4/1995 | Tang et al. |
| 5,484,922 A | 1/1996 | Moore et al. |
| 5,503,910 A | 4/1996 | Matsuura et al. |
| 5,552,678 A | 9/1996 | Tang et al. |
| 5,554,450 A | 9/1996 | Shi et al. |
| 5,593,788 A | 1/1997 | Shi et al. |
| 5,608,287 A | 3/1997 | Hung et al. |
| 5,635,308 A | 6/1997 | Inoue et al. |
| 5,645,948 A | 7/1997 | Shi et al. |
| 5,677,572 A | 10/1997 | Hung et al. |
| 5,683,823 A | 11/1997 | Shi et al. |
| 5,688,551 A | 11/1997 | Littman et al. |
| 5,703,436 A | 12/1997 | Forrest et al. |
| 5,714,838 A | 2/1998 | Haight et al. |
| 5,739,545 A | 4/1998 | Guha et al. |
| 5,755,999 A | 5/1998 | Shi et al. |
| 5,776,622 A | 7/1998 | Hung et al. |
| 5,776,623 A | 7/1998 | Hung et al. |
| 5,837,391 A | 11/1998 | Utsugi |
| 5,851,709 A | 12/1998 | Grande et al. |
| 5,908,581 A | 6/1999 | Chen et al. |
| 5,928,802 A | 7/1999 | Shi et al. |
| 5,935,720 A | 8/1999 | Chen et al. |
| 5,935,721 A | 8/1999 | Shi et al. |
| 5,969,474 A | 10/1999 | Arai |
| 5,972,247 A | 10/1999 | Shi et al. |
| 5,981,306 A | 11/1999 | Burrows et al. |
| 6,020,078 A | 2/2000 | Chen et al. |
| 6,066,357 A | 5/2000 | Tang et al. |
| 6,097,147 A | 8/2000 | Baldo et al. |

(Continued)

FOREIGN PATENT DOCUMENTS

| | | |
|---|---|---|
| EP | 564 224 | 10/1993 |
| EP | 0 681 019 | 11/1995 |

(Continued)

OTHER PUBLICATIONS

Machine English translation of JP 2003-115387 A. Sep. 5, 2014.*
M. E. Kondakova, et al., "Electroluminescent Devices Including Organic EIL Layer", U.S. Appl. No. 11/412,544, filed Apr. 27, 2006.
L. Cosimbescu, et al., "Electroluminescent Device Including an Anthracene Derivative", U.S. Appl. No. 11/412,285, filed Apr. 27, 2006.
Z. R. Owczarczyk, et al., "Electroluminescent Device Including an Anthracene Derivative", U.S. Appl. No. 11/412,602, filed Apr. 27, 2006.
D. Y. Kondakov, et al., "Electroluminescent Device Including an Anthracene Derivative", U.S. Appl. No. 11/412,426, filed Apr. 27, 2006.

(Continued)

*Primary Examiner* — J. L. Yang

(57) ABSTRACT

An electroluminescent device comprises a cathode, an anode, and has therebetween a light emitting layer (LEL), the device further containing an electron transport layer (ETL) comprising an anthracene compound on the cathode side of the LEL and an organic electron injection layer (EIL) between the ETL and the cathode comprising a phenanthroline compound, wherein the thickness of the EIL and LEL are such that the ratio of the thickness of the EIL to LEL is greater than 0.125.

2 Claims, 1 Drawing Sheet

(56) References Cited

U.S. PATENT DOCUMENTS

| | | |
|---|---|---|
| 6,137,223 A | 10/2000 | Hung et al. |
| 6,140,763 A | 10/2000 | Hung et al. |
| 6,172,459 B1 | 1/2001 | Hung et al. |
| 6,208,075 B1 | 3/2001 | Hung et al. |
| 6,208,077 B1 | 3/2001 | Hung |
| 6,226,890 B1 | 5/2001 | Boroson et al. |
| 6,237,529 B1 | 5/2001 | Spahn et al. |
| 6,278,236 B1 | 8/2001 | Madathil et al. |
| 6,337,492 B1 | 1/2002 | Jones et al. |
| 6,413,656 B1 | 7/2002 | Thompson et al. |
| 6,451,415 B1 | 9/2002 | Forrest et al. |
| 6,451,455 B1 | 9/2002 | Thompson et al. |
| 6,458,475 B1 | 10/2002 | Adachi et al. |
| 6,465,115 B2 | 10/2002 | Shi et al. |
| 6,515,298 B2 | 2/2003 | Forrest et al. |
| 6,558,817 B1 * | 5/2003 | Ueda et al. ............ 428/690 |
| 6,573,651 B2 | 6/2003 | Adachi et al. |
| 6,664,396 B1 | 12/2003 | Cosimbescu |
| 6,720,573 B2 | 4/2004 | Son et al. |
| 6,821,649 B2 * | 11/2004 | Kambe et al. ............ 428/690 |
| 6,878,469 B2 | 4/2005 | Yoon et al. |
| 6,914,269 B2 | 7/2005 | Nakamura |
| 2002/0015859 A1 | 2/2002 | Watanabe et al. |
| 2002/0025419 A1 | 2/2002 | Lee et al. |
| 2002/0100906 A1 | 8/2002 | Takiguchi et al. |
| 2002/0121638 A1 | 9/2002 | Grushin et al. |
| 2002/0197511 A1 | 12/2002 | D Andrade et al. |
| 2003/0017361 A1 | 1/2003 | Thompson et al. |
| 2003/0040627 A1 | 2/2003 | Fujii |
| 2003/0054198 A1 | 3/2003 | Tsuboyama et al. |
| 2003/0059646 A1 | 3/2003 | Kamatani et al. |
| 2003/0068526 A1 | 4/2003 | Kamatani et al. |
| 2003/0068528 A1 | 4/2003 | Thompson et al. |
| 2003/0068535 A1 | 4/2003 | Takiguchi et al. |
| 2003/0071565 A1 | 4/2003 | Hatwar et al. |
| 2003/0072964 A1 | 4/2003 | Kwong et al. |
| 2003/0124381 A1 | 7/2003 | Thompson et al. |
| 2003/0134145 A1 * | 7/2003 | Toguchi .............. C09K 11/06 428/690 |
| 2003/0141809 A1 | 7/2003 | Furugori et al. |
| 2003/0165715 A1 * | 9/2003 | Yoon et al. ............ 428/690 |
| 2003/0170491 A1 * | 9/2003 | Liao et al. ............ 428/690 |
| 2003/0198829 A1 | 10/2003 | Hoag et al. |
| 2003/0201415 A1 | 10/2003 | Hoag et al. |
| 2003/0215667 A1 | 11/2003 | Xie |
| 2004/0001969 A1 | 1/2004 | Cosimbescu et al. |
| 2004/0018383 A1 | 1/2004 | Aziz et al. |
| 2004/0023060 A1 | 2/2004 | Kim et al. |
| 2004/0142209 A1 | 7/2004 | Toguchi et al. |
| 2004/0234809 A1 | 11/2004 | Chen et al. |
| 2004/0255857 A1 | 12/2004 | Chow et al. |
| 2005/0019604 A1 | 1/2005 | Thompson et al. |
| 2005/0025993 A1 | 2/2005 | Thompson et al. |
| 2005/0064235 A1 * | 3/2005 | Liao et al. ............ 428/690 |
| 2005/0089715 A1 | 4/2005 | Cosimbescu et al. |
| 2005/0112407 A1 | 5/2005 | Ogasawara et al. |
| 2005/0121666 A1 | 6/2005 | Kondakova et al. |
| 2005/0123797 A1 | 6/2005 | Kondakova et al. |
| 2005/0170204 A1 | 8/2005 | Vargas et al. |
| 2005/0208327 A1 * | 9/2005 | Begley et al. ............ 428/690 |
| 2005/0211958 A1 * | 9/2005 | Conley .............. C09K 11/06 252/583 |
| 2005/0212409 A1 * | 9/2005 | Shi et al. ............ 313/504 |
| 2005/0260442 A1 | 11/2005 | Yu et al. |
| 2005/0266186 A1 | 12/2005 | Nguyen et al. |
| 2005/0280008 A1 | 12/2005 | Ricks et al. |
| 2006/0008674 A1 | 1/2006 | Yu et al. |
| 2006/0040131 A1 | 2/2006 | Klubek et al. |
| 2006/0040132 A1 * | 2/2006 | Liao et al. ............ 428/690 |
| 2006/0134460 A1 | 6/2006 | Kondakova et al. |
| 2007/0252515 A1 | 11/2007 | Cosimbescu et al. |
| 2007/0252516 A1 | 11/2007 | Kondakova et al. |
| 2007/0252521 A1 * | 11/2007 | Kondakov et al. ............ 313/506 |
| 2007/0252522 A1 | 11/2007 | Kondakova et al. |

FOREIGN PATENT DOCUMENTS

| | | | |
|---|---|---|---|
| EP | 0 732 868 | 9/1996 | |
| EP | 0 849 979 | 6/1998 | |
| EP | 0 891 121 | 1/1999 | |
| EP | 1 009 041 | 6/2000 | |
| EP | 1 029 909 | 8/2000 | |
| EP | 1 076 368 | 2/2001 | |
| EP | 1 182 244 | 2/2002 | |
| EP | 1 187 235 | 3/2002 | |
| EP | 1 238 981 | 9/2002 | |
| EP | 1 239 526 | 9/2002 | |
| EP | 1 244 155 | 9/2002 | |
| EP | 1 286 568 | 2/2003 | |
| EP | 1 341 403 | 9/2003 | |
| EP | 1 469 533 | 10/2004 | |
| EP | 1 478 032 | 11/2004 | |
| EP | 1 480 280 | 11/2004 | |
| JP | 09-13026 | 1/1997 | |
| JP | 2001-267080 | 9/2001 | |
| JP | 2001-335516 | 12/2001 | |
| JP | 2003-059667 | 2/2003 | |
| JP | 2003-073387 | 3/2003 | |
| JP | 2003-073388 | 3/2003 | |
| JP | 2003-073665 | 3/2003 | |
| JP | 2003-115387 | 4/2003 | |
| JP | 2003-123983 | 4/2003 | |
| JP | 2003115387 A * | 4/2003 | ............ H05B 33/22 |
| JP | 2003-138251 | 5/2003 | |
| JP | 2003-146951 | 5/2003 | |
| JP | 2003-338377 | 11/2003 | |
| JP | 2003338377 | 11/2003 | |
| JP | 2004-059535 | 2/2004 | |
| JP | 2004-175691 | 6/2004 | |
| JP | 2004-200162 | 7/2004 | |
| JP | 2004-311184 | 11/2004 | |
| JP | 2005-170911 | 6/2005 | |
| JP | 2005-174675 | 6/2005 | |
| JP | 2005174675 | 6/2005 | |
| WO | WO 98/55561 | 12/1998 | |
| WO | WO 00/18851 | 4/2000 | |
| WO | WO 00/57676 | 9/2000 | |
| WO | WO 00/70655 | 11/2000 | |
| WO | WO 01/39234 | 5/2001 | |
| WO | WO 01/41512 | 6/2001 | |
| WO | WO 01/93642 | 12/2001 | |
| WO | WO 02/15645 | 2/2002 | |
| WO | WO 02/43449 | 5/2002 | |
| WO | WO 02/071813 | 9/2002 | |
| WO | WO 02/074015 | 9/2002 | |
| WO | 03/060956 | 7/2003 | |
| WO | WO 03/060956 | 7/2003 | |
| WO | WO 2004/018587 | 3/2004 | |
| WO | WO 2004/026870 | 4/2004 | |
| WO | 2004/053018 | 6/2004 | |
| WO | WO 2004/053018 | 6/2004 | |
| WO | WO 2005/013388 | 2/2005 | |
| WO | WO 2005/097756 | 10/2005 | |
| WO | WO 2005/100506 | 10/2005 | |
| WO | 2006/004138 | 1/2006 | |
| WO | WO 2006/004138 | 1/2006 | |
| WO | WO 2007/018004 | 2/2007 | |
| WO | WO 2007/021117 | 2/2007 | |

OTHER PUBLICATIONS

Dresner, "Double Injection Electroluminescence in Anthracene", RCA Review, 30, 322, 1969.

C. Tang et al., J. Applied Physics, vol. 65, 3610, 1989.

Aspley et al., "Palladium-catalysed cross-couping reactions of ruthenium bis-terpyridyl complexes: strategies for the incorporation and exploitation of boronic acid funcationality", New J. Chem., 25, pp. 1136-1147, 2001.

Riesgo et al., "Introduction of Benzo[h]quinoline and 1,10-Phenanthroline Subunits by Friedländer Methodology", J. Org. Chem. 61, pp. 3017-3022, 1996.

C. Bonnefous et al. Cyclometalated Complexes of Ru(II) with 2-Aryl Derivatives of Quinoline and 1, 10-Phenanthroline:, Inorg. Chem. 2001, 40, pp. 5851-5859.

(56) References Cited

OTHER PUBLICATIONS

M.E. Kondakova et al. "High-Efficiency Low-Voltage Phosphorescent OLED Devices with Mixed Host", SID Digest, 2007, pp. 837-840.
C.J. Tonzola et al, "New n-Type Organic Semiconductors: Synthesis, Single Crystal Structures, Cyclic Voltammetry, Photophysics, Electron Transport and Electroluminescence of a Series of Diphenylanthrazolines", J. Am. Chem. Soc., 2003, pp. 13548-13558.
R. Wang et al. "1-Methyl-2-(anthryl)-imidazo[4,5-f][1,10]-phenanthroline: A Highly Efficient Electron-Transport Compount and a Bright Blue-Light Emitter for Electroluminescent Devices", Advanced Functional Materials, 2005, pp. 1483-1487.

\* cited by examiner

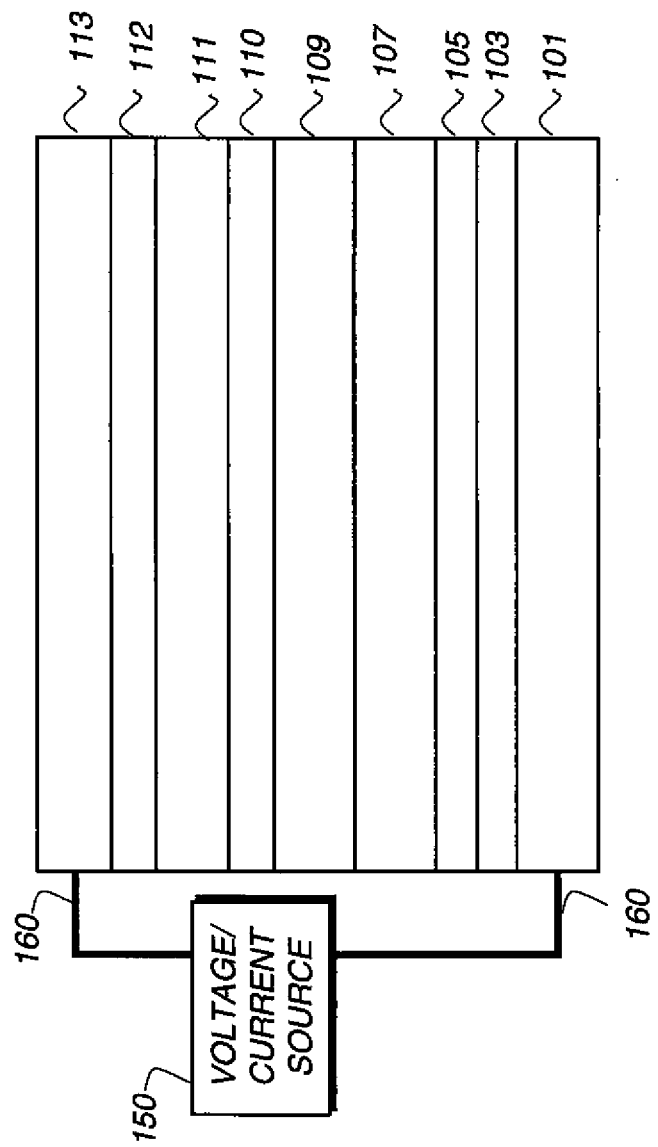

ELECTROLUMINESCENT DEVICE INCLUDING AN ANTHRACENE DERIVATIVE

CROSS-REFERENCE TO RELATED APPLICATIONS

Reference is made to commonly assigned U.S. Pat. application Ser. No. 11/289,856, filed Nov. 30,2005, entitled "Electroluminescent Device Containing An Anthracene Derivative" by Klubek et al; U.S. Pat. application Ser. No. 11/290,214 filed Nov. 30, 2005, entitled "Electroluminescent Device Containing A Phenanthroline Derivative" by Klubek et al; U.S. Pat. application Ser. No. 11/412,544 filed Apr. 27, 2006, entitled "Electroluminescent Devices Including Organic EIL Layer" by Kondakova et al; U.S. Pat. application Ser. No. 11/412,285 filed Arp. 27, 2006, entitled "Electroluminescent Device Including an Anthracene Derivative" Cosimbescu et al; U.S. Pat. application Ser. No. 11/412,602 filed Arp. 27, 2006, entitled "Electroluminescent Device Including an Anthracene Derivative" by Owczarczyk et al and U.S. Pat. application Ser. No. 11/412,676 filed Arp. 27, 2006, entitled "Electroluminescent Device Including an Anthracene Derivative" by Kondakov et al, the disclosures of which are incorporated herein.

FIELD OF THE INVENTION

This invention relates to an electroluminescent (EL) device comprising a light-emitting layer and including at least one electron transport layer containing an anthracene derivative and at least one electron injection layer contiguous to the electron transport layer and containing a phenanthroline derivative. The device can provide desirable electroluminescent properties.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and enabled devices to operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

EL devices that emit white light have proven to be very useful. They can be used with color filters to produce full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices. It is also desirable to have devices that operate with low voltage.

One of the most common materials used in many OLED devices is tris(8-quinolinolato)aluminum (III) (Alq). This metal complex is an excellent electron-transporting material and has been used for many years in the industry. However, other materials such as anthracene derivatives have also been reported as useful electron-transporting materials, for example see JP 2005/174675.

Ara Kensuke and coworkers (JP 2003/338377) report an EL device in which the electron transport layer contains a naphthacene derivative and/or an anthracene derivative but preferably a naphthacene derivative. The device also preferably includes an electron injection layer having a thickness of, preferably, 0.6 to 20 nm, and in particular, preferably, 1 to 10 nm. However, such a device may not yield the most desirable electroluminescent properties. Thus there is a need to find materials and architecture to afford devices with low voltage or high efficiency or both.

SUMMARY OF THE INVENTION

The invention provides an electroluminescent device comprising a cathode, an anode, and having therebetween a light emitting layer (LEL), the device further containing an electron transport layer (ETL) comprising an anthracene compound on the cathode side of the LEL and an organic electron injection layer (EIL) between the ETL and the cathode comprising a phenanthroline compound, wherein the thickness of the EIL and LEL are such that the ratio of the thickness of the EIL to LEL is greater than 0.125. The device of the invention provides improved electroluminescent properties such as drive voltage and efficiency.

BRIEF DESCRIPTION OF THE DRAWINGS

The FIGURE shows a schematic cross-sectional view of an OLED device that represents one embodiment of the present invention.

DETAILED DESCRIPTION OF THE INVENTION

The invention is generally summarized above. The invention provides for a multilayer electroluminescent device comprising a cathode, an anode, and at least one light-emitting layer (LEL). The device further contains an electron transport layer (ETL) on the cathode side of the LEL that includes an anthracene compound.

In one desirable embodiment, the anthracene compound only contains one anthracene nucleus in order to keep the sublimation temperature in a desirable temperature range. In another embodiment, the anthracene compound includes only 6 to 12 rings, or even only 6 to 10 rings. Desirably the rings are carbocyclic.

In a further embodiment, the anthracene compound is substituted with aromatic groups in the 2-, 9-, and 10-positions. This type of substitution affords desirable electrochemical properties. In one suitable embodiment, the monoanthracene compound is substituted with a naphthyl or a biphenyl group in the 9-position and an independently selected naphthyl or a biphenyl group in the 10-position. Examples of suitable groups include 2-naphthyl groups, 1-naphthyl groups, 4-biphenyl groups, and 3-biphenyl groups. Useful groups also include phenyl groups and terphenyl groups. In one desirable embodiment, the monoanthracene compound is substituted with an aryl group in the 2-position that includes no more than 2 fused rings, for example a 4-methylphenyl group, a 2-naphthyl group, or an unsubstituted phenyl.

In a still further embodiment, the monoanthracene compound is substituted with hydrogen or an alkyl group in the 6-position. Examples of alkyl groups include a methyl group and a t-butyl group.

In an alternative embodiment, the monoanthracene compound is substituted with an aromatic group in the 6-position. Desirably the aromatic group is a carbocyclic group with no more than two fused rings, such as a phenyl group or a naphthyl group.

In another suitable embodiment, the anthracene compound is represented by Formula (1).

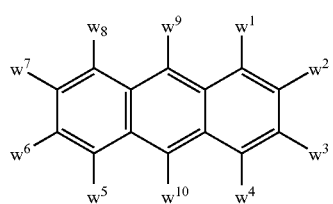

(1)

In Formula (1), $w^1$, $w^3$, $w^4$, $w^5$, $w^6$, $w^7$ and $w^8$ represent hydrogen or an independently selected substituent group, such as an alkyl group, for example a methyl group or a t-butyl group, or an aromatic group such as a phenyl group or a naphthyl group.

The substituents $w^2$, $w^9$, and $w^{10}$ represent independently selected aromatic groups. Illustrative examples include, phenyl groups, terphenyl groups, naphthyl groups, biphenyl groups, benzimidazole groups, and thiophene groups. In one desirable embodiment, $w^2$, $w^9$, and $w^{10}$ represent independently selected carbocyclic aromatic groups. In a further embodiment, $w^2$, $w^9$, and $w^{10}$ represent independently selected aromatic groups, wherein each aromatic group includes no more than 2 fused rings. In another embodiment, substituents $w^1$ through $w^{10}$ each comprise no more than two fused rings. In one suitable embodiment, $w^2$, $w^6$, $w^9$, and $w^{10}$ may be the same or different and each represents an independently selected aromatic group, such as a phenyl group or a naphthyl group.

In a further embodiment, the substituents on the anthracene compound are chosen so that the anthracene compound has a LUMO (lowest occupied molecular orbital) energy value in the range of −2.4 eV to −2.6 eV. Desirably the range is −2.45 eV to −2.55 eV.

Suitable anthracene compounds can be prepared by various synthetic routes described in the literature or by variations of such routes, for example as reported in US 2005/211958, which is incorporated herein by reference. Examples of useful anthracene compounds are shown below.

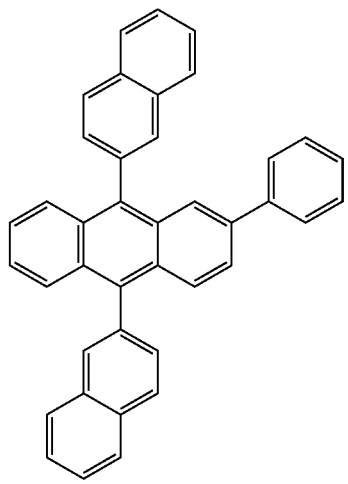

I-1

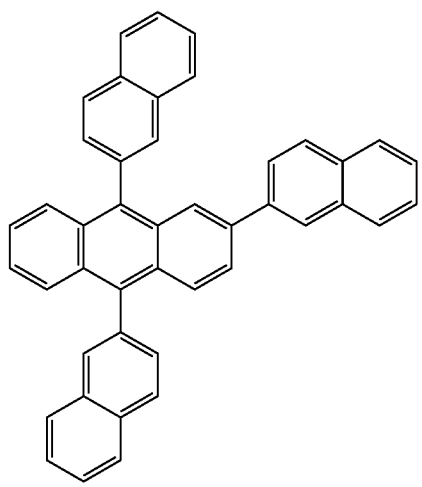

I-2

I-3
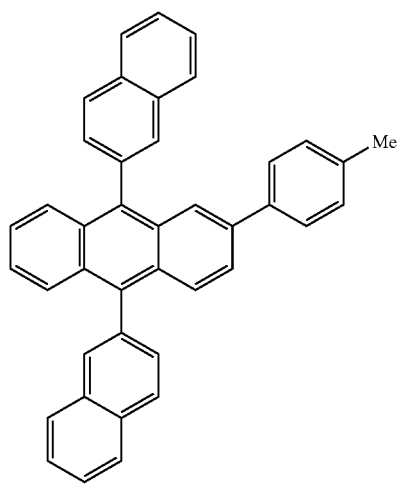
I-4
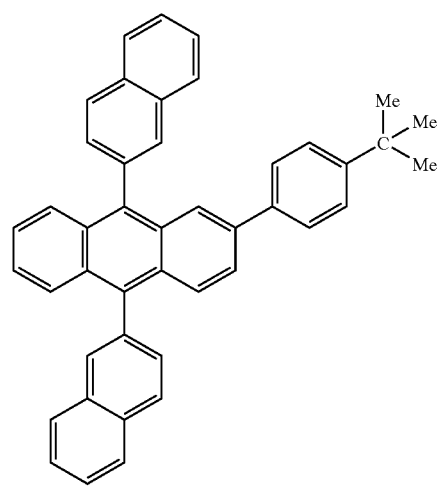
I-5
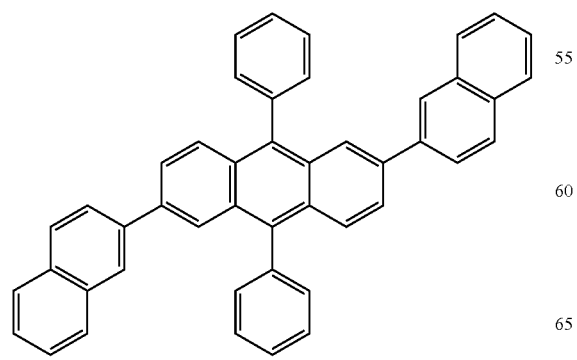
I-6
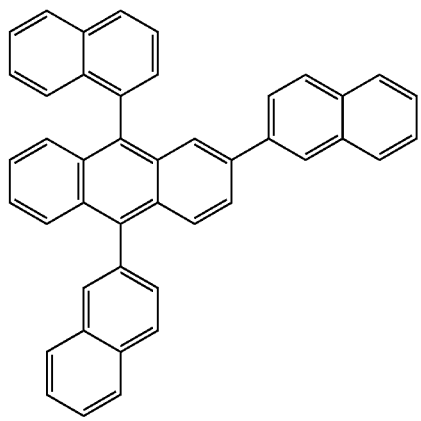
I-7
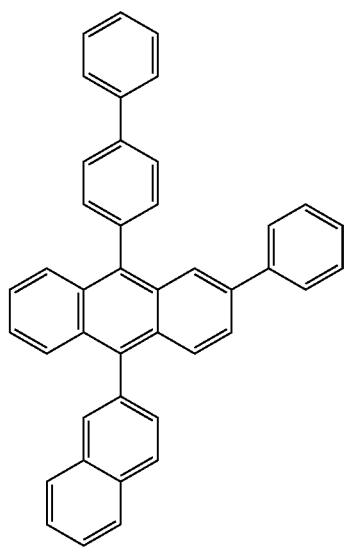
I-8
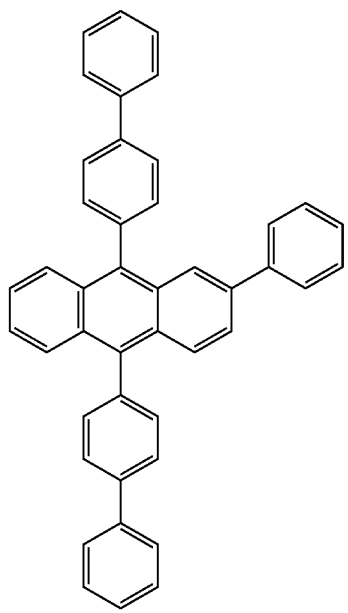

I-9
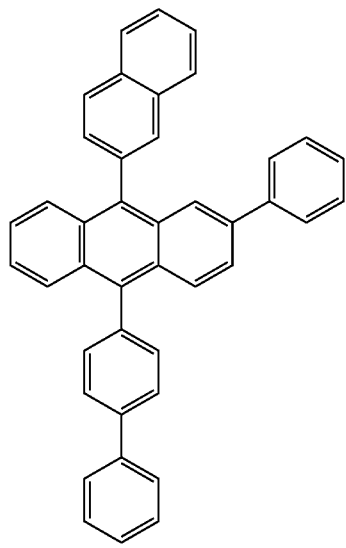
I-10
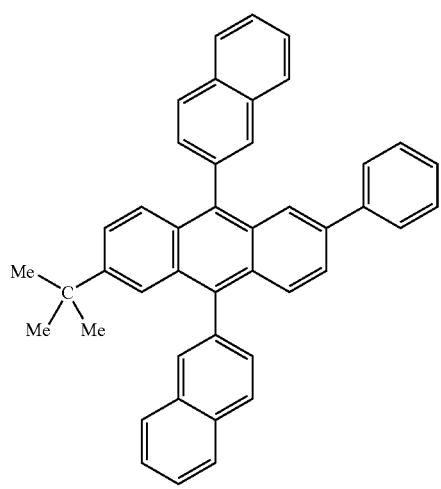
I-11
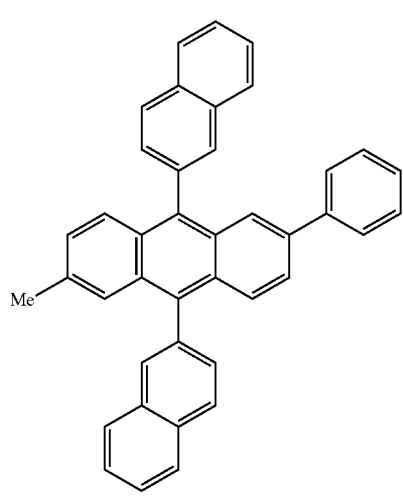
I-12
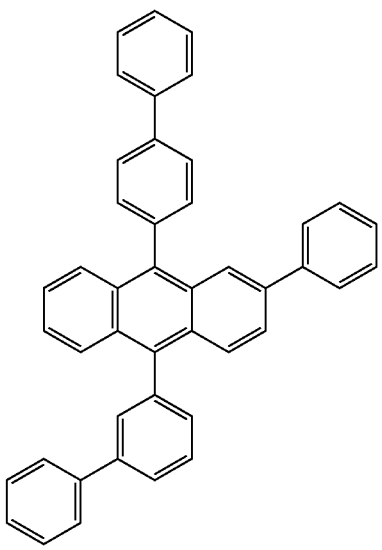
I-13
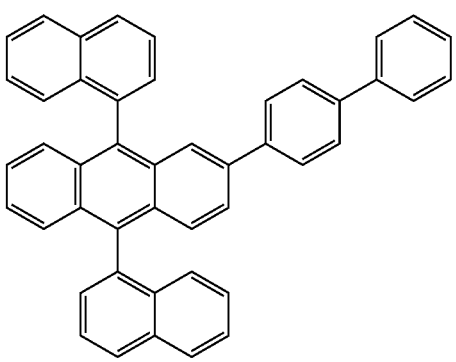
I-14
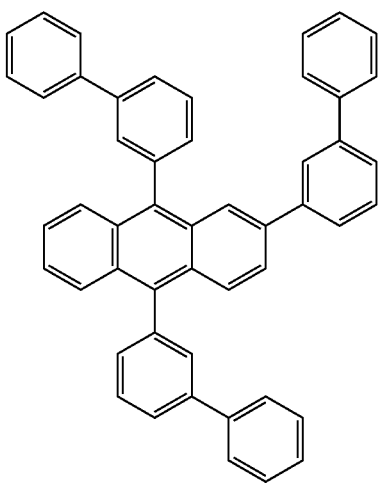

I-15
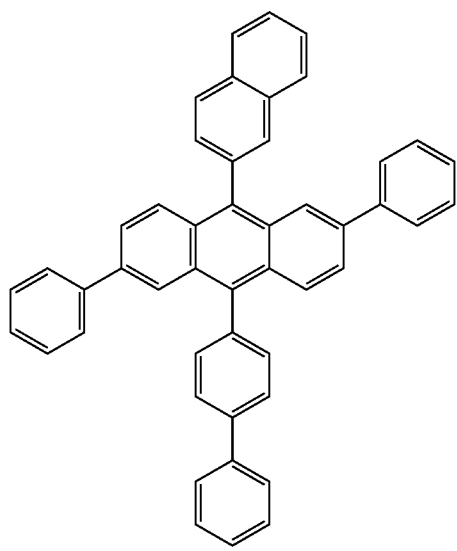
I-16
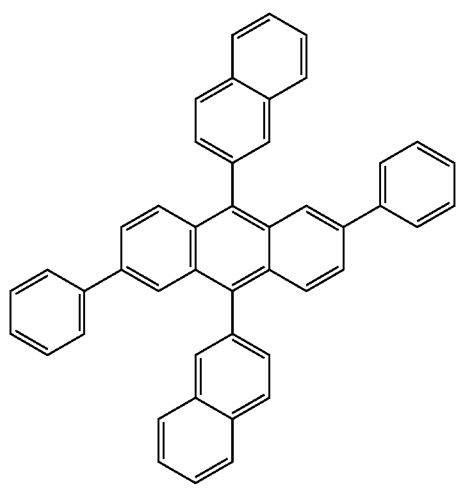
I-17
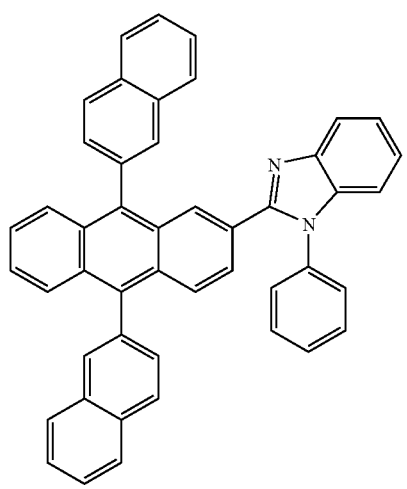
I-18
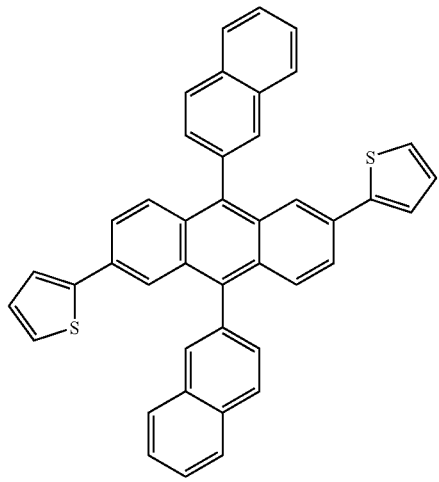
I-19
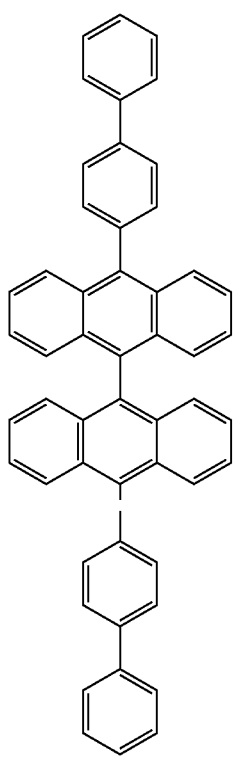
I-20
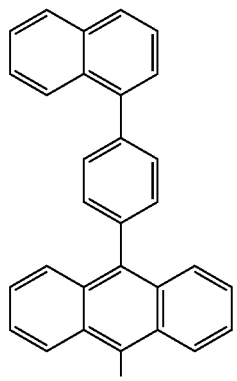

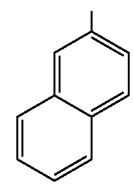
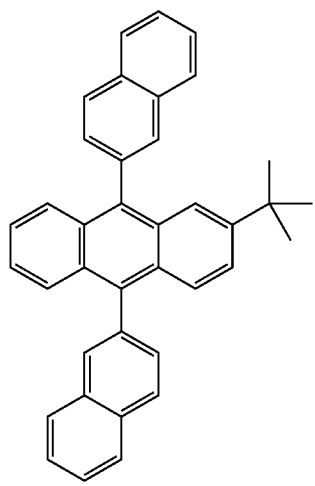
I-21
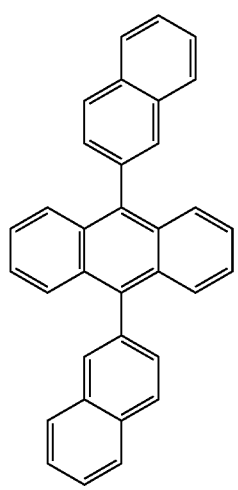
I-22
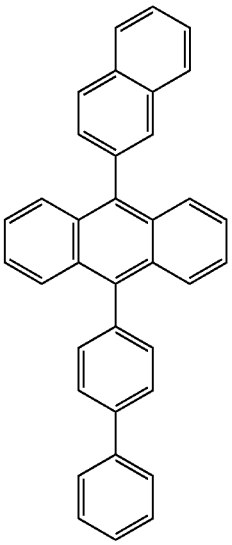 [SMILES: c1ccc(-c2ccc(-c3c4ccccc4c(-c4ccc5ccccc5c4)c4ccccc34)cc2)cc1]
I-23
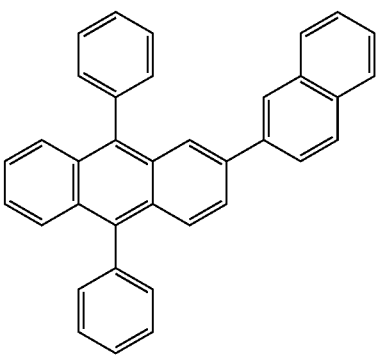
I-24
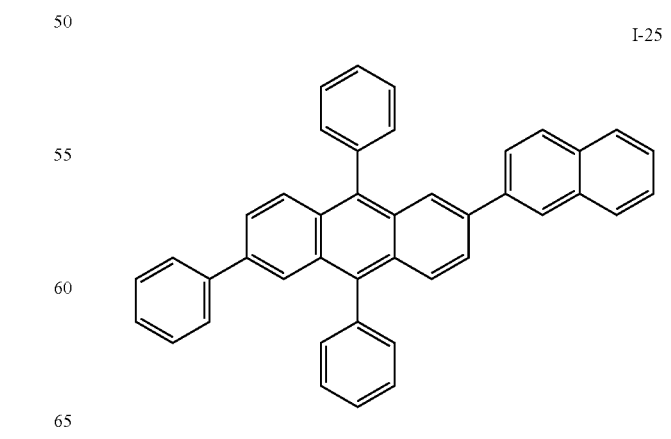
I-25

-continued

I-26

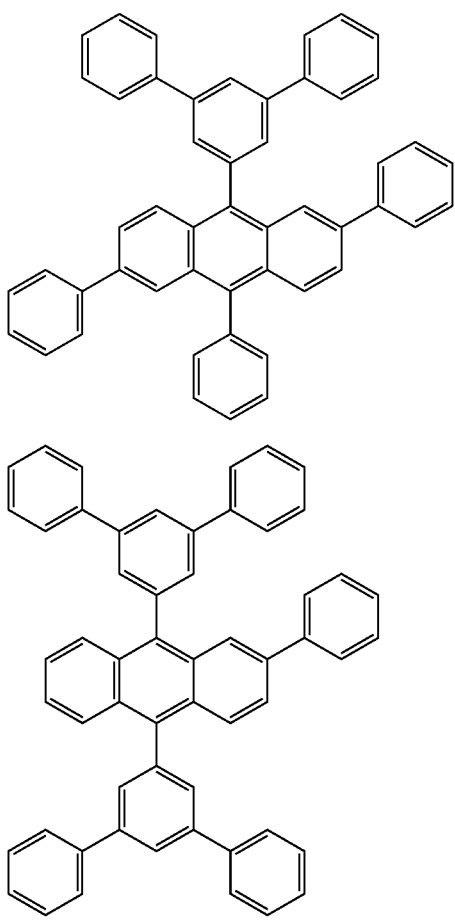

I-27

The electron transport layer may include more than one type of anthracene compound. In one desirable embodiment, the ETL includes only anthracene compounds. A desirable thickness of the electron transport layer is often 1 to 100 nm, frequently 5 to 50 nm, and commonly 10 to 40 nm.

An electron injection layer (EIL) is present on the cathode side of the ETL and contiguous to the ETL. The EIL includes a phenanthroline compound. In one desirable embodiment, the phenanthroline compound includes a 1,10-phenanthroline group. In another embodiment, the phenanthroline compound is represented by Formula (2). In Formula (2), each r is the same or different, and each represents a substituent, such as a methyl group or a phenyl group. In Formula (2), m and p are independently 0-4, and n is 0-2.

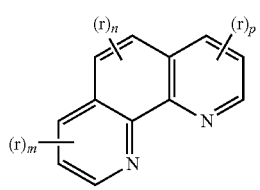
(2)

In one suitable embodiment, at least one of r in Formula (2) represents an aromatic group including at least three fused rings, for example an anthracenyl group or a pyrenyl group. In this embodiment at least one of m, n, and p is 1 or greater. Useful phenanthroline materials include those described in commonly assigned Ser. Nos. 11/289,856 and 11/290,214, both filed Nov. 30, 2005, the disclosures of which are incorporated herein by reference.

In a further embodiment, the phenanthroline compound includes more than one 1,10-phenanthroline nucleus. Suitably the phenanthroline compound includes two 1,10-phenanthroline nuclei that are directly bonded to one another. In another suitable embodiment, the phenanthroline compound includes two 1,10-phenanthroline nuclei that are connected by a linking group. In a suitable embodiment, the phenanthroline compound is represented by Formula (3).

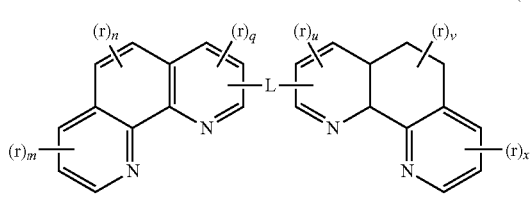
(3)

In Formula (3), as described above, each r is the same or different, and each represents a substituent. In the Formula, m and x are independently 0-4; n, v, q, and u are independently 0-2. L represents a divalent linking group, that is, a divalent species that bonds two independently selected phenanthroline groups together. For instance, the linking group could be a divalent aromatic group, a divalent alkyl group, or a divalent heteroatom. Non-limiting examples of linking groups are shown below.

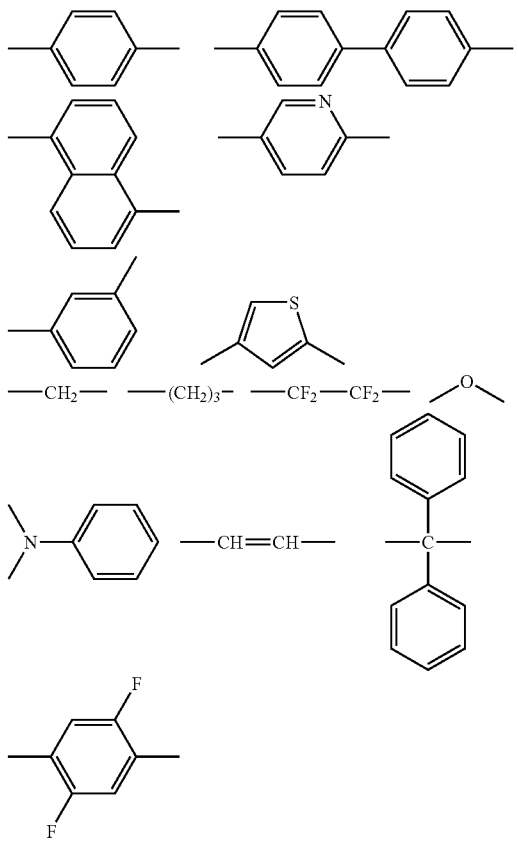

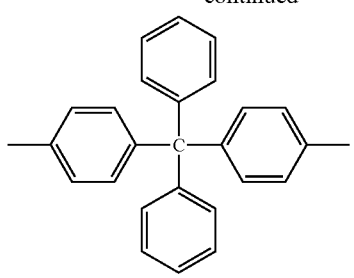
Examples of useful 1,10-phenanthroline materials are listed below.
II-1
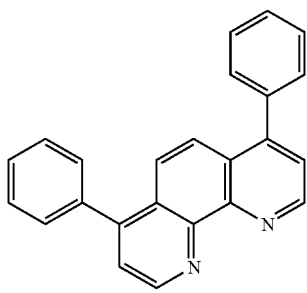
(Bphen)
II-2
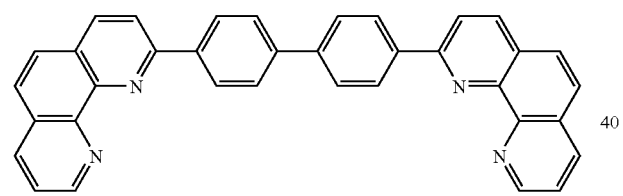
II-3
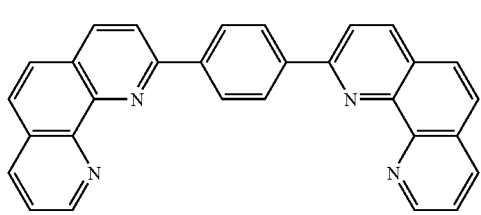
II-4
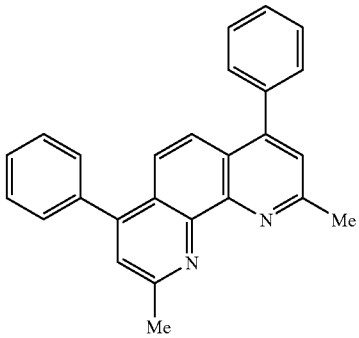
II-5
II-6
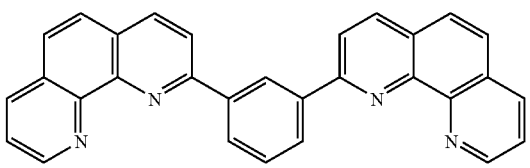
II-7
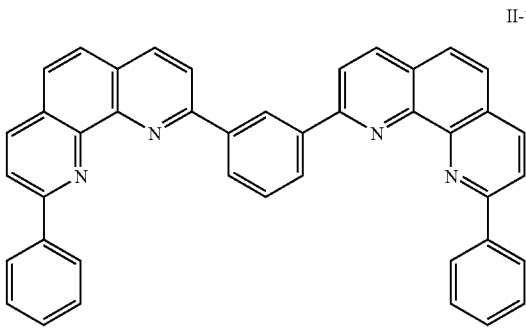
II-8
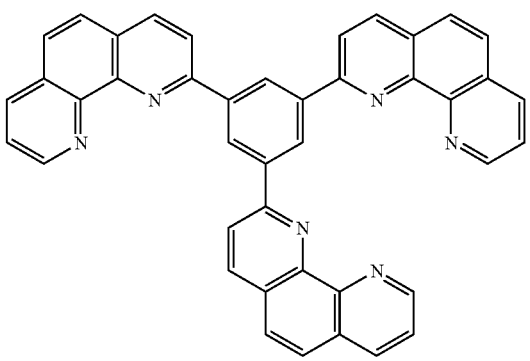
II-9
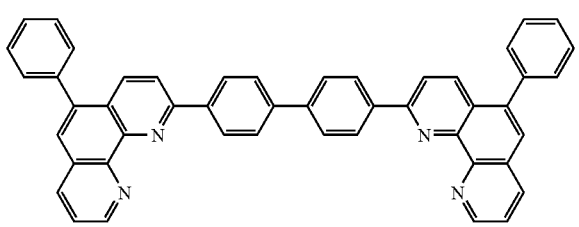

II-10
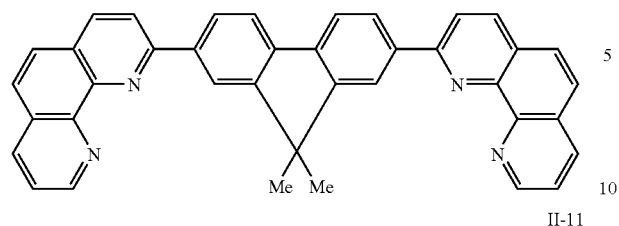
II-11
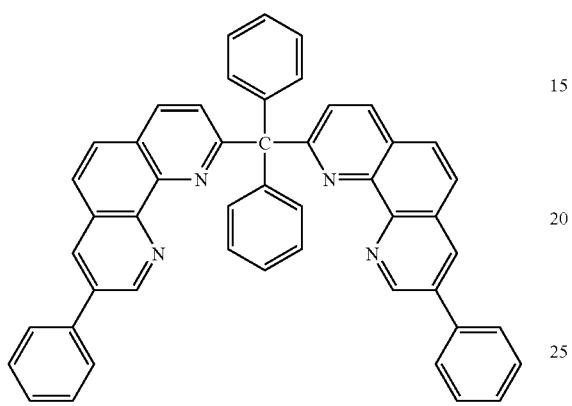
II-12
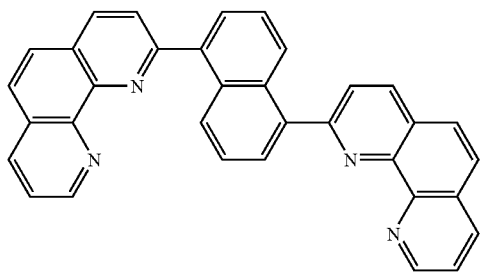
II-13
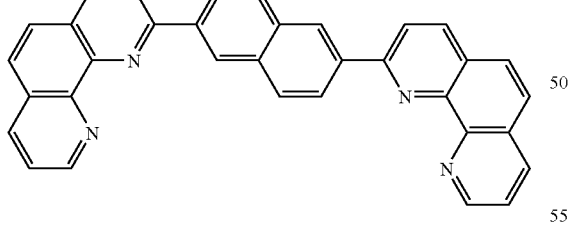
II-14
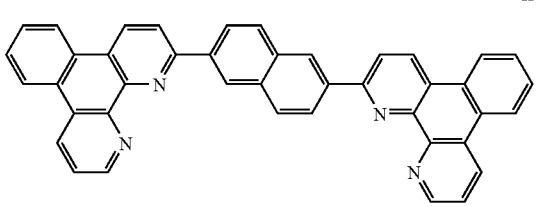
II-15
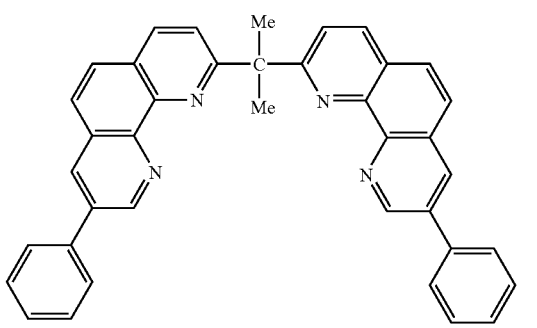
II-16
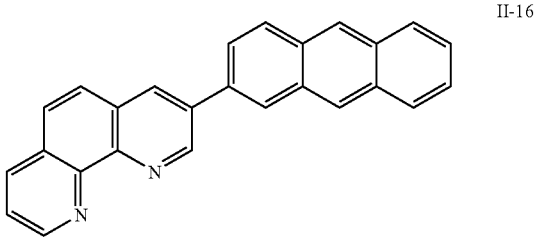
II-17
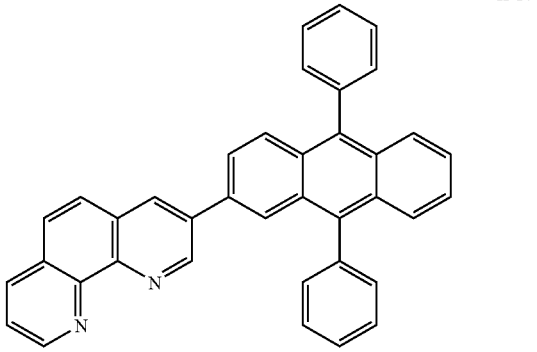
II-18
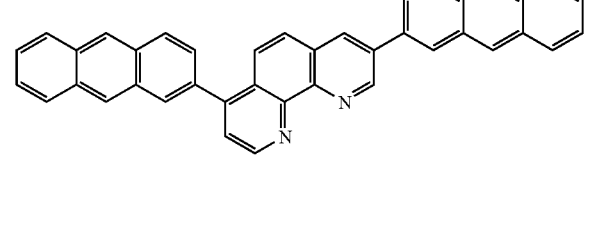
II-19
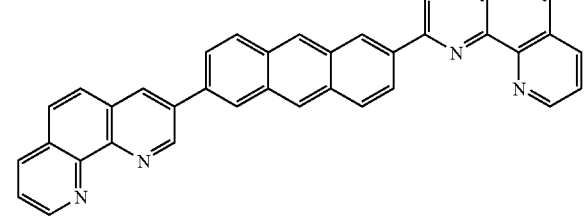

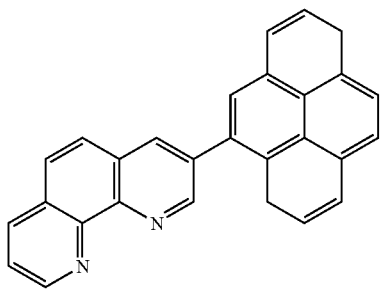

II-20

Desirably, the LUMO energy level of the phenanthroline compound is equal to or nearly the same as the LUMO energy level of the anthracene material contained in the ETL. In one embodiment, the LUMO energy level of the phenanthroline compound is equal to or more positive than the LUMO energy level of the anthracene material. Suitably, the difference in LUMO energy levels of the EIL phenanthroline compound and the ETL anthracene material is 0.50 or less, 0.40 or less, 0.30 or less, 0.20 or less or even 0.10 eV or less. Desirably the phenanthroline compound in the EIL has a LUMO energy value equal to or more positive than the LUMO energy value of the anthracene compound in the ETL.

A desirable thickness of the electron injection layer is often 1 to 30 nm, frequently 5 to 20 nm, and commonly in the range of 10 to 20 nm. In order to obtain the optimum device performance, it is important to optimize the thickness of each layer of an EL device. We have found that the relative thickness of the EIL to that of the LEL is also important. The ratio of the thickness of the EIL to LEL should be greater than 0.125. Desirably this ratio is 0.25 or greater, or even 0.50 or greater. In one embodiment, the ratio of the thickness of the EIL to LEL is in the range of 0.125 to 1.50 or desirably in the range of 0.125 to 1.25.

In another desirable embodiment, a further layer is present between the cathode and the EIL and contiguous to the EIL. This layer represents an additional electron injection layer. Desirably the further layer includes an inorganic material such as a low work-function alkaline metal or alkaline earth metal, such as Li, Cs, Ca, Mg. In addition, an organic material doped with these low work-function metals can also be used effectively as the electron-injecting layer. Examples are Li- or Cs-doped Alq. In one suitable embodiment the further layer includes an alkali metal compound, such as LiF. The further layer is often a thin layer deposited to a suitable thickness in a range of 0.1-3.0 nm.

A light-emitting layer is on the anode side of the electron transport layer. The light-emitting layer can be comprised of a single material, but more commonly consists of a host material doped with a guest emitting material or materials where light emission comes primarily from the emitting materials and can be of any color.

In one aspect of the invention, the light-emitting layer includes a host material and a light-emitting material. Desirably, the LUMO energy level of the anthracene compound in the ETL is close to or slightly below the LUMO level of the host in the light-emitting layer. In one embodiment, the LEL includes a host material having a LUMO energy value that differs from the LUMO energy value of the anthracene compound in the ETL by no more than 0.2 eV or even no more than 0.1 eV. In a further embodiment, the LUMO energy level of the ETL anthracene compound is equal to the LUMO energy level of the host in the light-emitting layer.

In one suitable embodiment, the light-emitting layer includes an anthracene host material. Particularly useful anthracene host materials include anthracene substituted in the 9- and 10-positions with aromatic groups. In one desirable embodiment, the anthracene host material bears aromatic groups in the 2-, 9-, and 10-positions. Examples of such groups include phenyl groups, naphthyl groups, and biphenyl groups.

Illustrative examples of anthracene materials for use in a light-emitting layer include: 2-(4-methylphenyl)-9, 10-di-(2-naphthyl)-anthracene; 9-(2-naphthyl)-10-(1,1'-biphenyl)-anthracene; 9,10-bis[4-(2,2-diphenylethenyl)phenyl]-anthracene, as well as the following listed compounds.

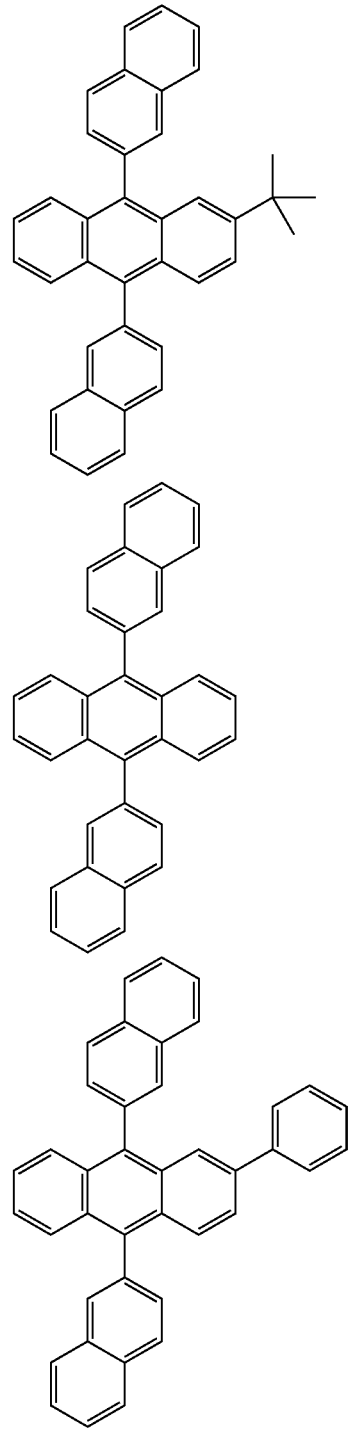

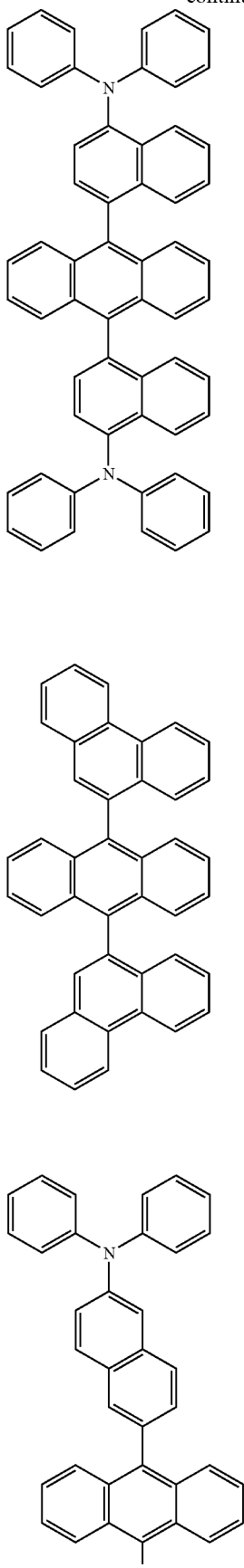
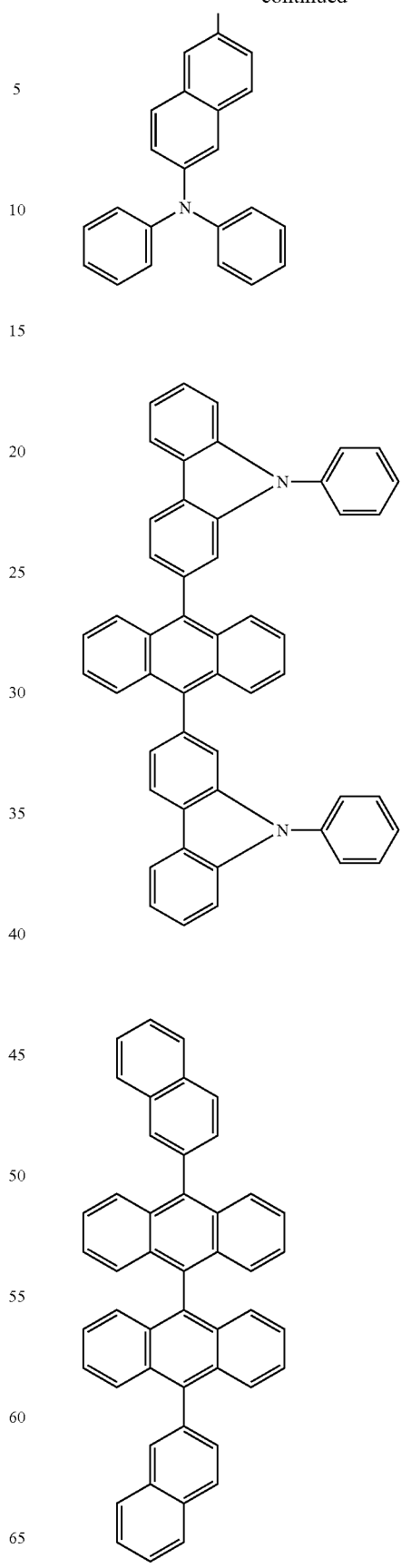

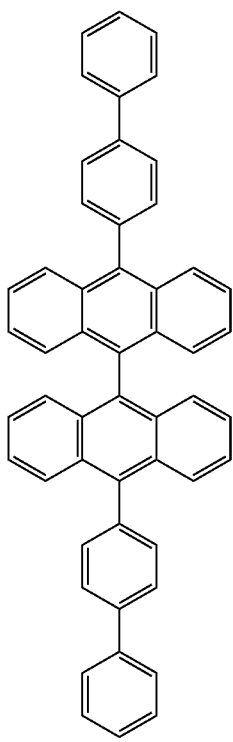

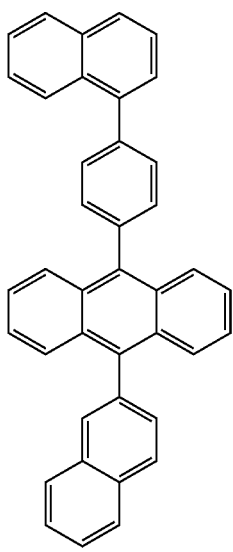

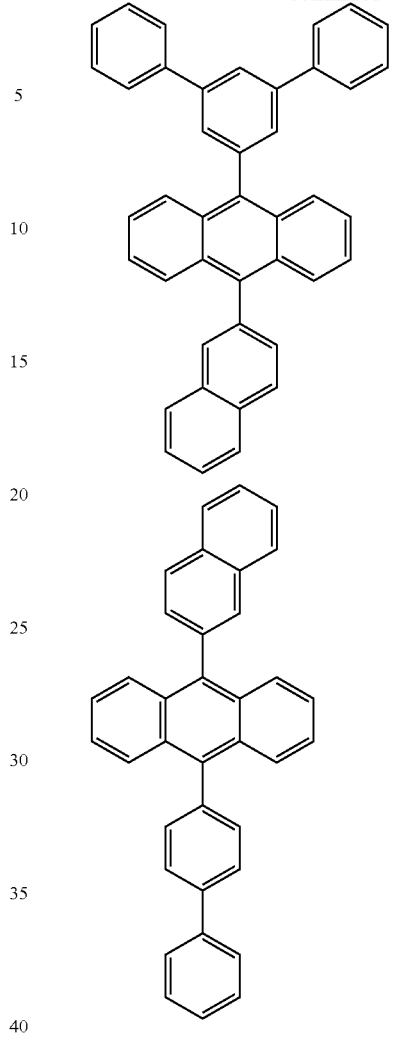

In one embodiment, a co-host is present in the light-emitting layer. For example the co-host may be a hole-transporting material such as a tertiary amine or a mixture of such compounds. Examples of useful hole-transporting co-host materials are 4,4'-bis[N-(1-naphthyl)-N-phenylamino]biphenyl (NPB), and 4,4'-bis[N-(1-naphthyl)-N-(2-naphthyl)amino]biphenyl (TNB).

In another embodiment, a co-host that is an electron-transporting material is present. Metal complexes of 8-hydroxyquinoline and similar derivatives, also known as metal-chelated oxinoid compounds, constitute a class of useful co-host compounds. A useful example of electron-transporting co-host material is tris(8-quinolinolato)aluminum(III) (Alq).

When present, the co-host is often at a level of 1-50% of the layer, frequently at 1-20% of the layer, and commonly at a level of 5-15% of the layer by volume.

In addition to a host, the LEL includes a light-emitting material(s) which is desirably present in an amount of up to 15% of the light-emitting layer by volume, commonly 0.1-10% and more typically from 0.5-8.0% of the layer by volume.

Desirably the light-emitting layer includes a light-emitting fluorescent material. An important relationship for choosing a light-emitting fluorescent material for use with a host is a comparison of the excited singlet-state energies of the host and the fluorescent material. It is highly desirable that the excited singlet-state energy of the light-emitting material be lower than that of the host material. The excited singlet-state energy is defined as the difference in energy between the emitting singlet state and the ground state. For non-emissive hosts, the lowest excited state of the same electronic spin as the ground state is considered the emitting state.

The layer may emit light ranging from blue to red depending on the nature of the light-emitting material. Blue light is generally defined as having a wavelength range in the visible region of the electromagnetic spectrum of 450-480 nm, blue-green 480-510 nm, green 510-550, green-yellow 550-570 nm, yellow 570-590 nm, orange 590-630 nm and red 630-700 nm, as defined by R. W. Hunt, *The Reproduction of Colour in Photography, Printing & Television*, 4$^{th}$ Edition 1987, Fountain Press. Suitable combinations of these components produce white light.

In one embodiment, a useful device includes one or more materials that emit blue or blue-green light. Many materials that emit blue or blue-green light are known in the art and are contemplated for use in the practice of the present invention. Particularly useful classes of blue emitters include perylene and its derivatives such as a perylene nucleus bearing one or more substituents such as an alkyl group or an aryl group. A desirable perylene derivative for use as an emitting material is 2,5,8,11-tetra-t-butylperylene.

Another useful class of fluorescent materials includes blue or blue-green light emitting derivatives styrylarenes, such as distyrylbenzene and distyrylbiphenyl, including compounds described in U.S. Pat. No. 5,121,029. Among derivatives of styrylarenes that provide blue or blue-green luminescence, particularly useful are those substituted with diarylamino groups, also known as styrylamines. Examples include those represented by Formula (4a), listed below, wherein $Ar_1$, each $Ar_2$, and $Ar_3$ through $Ar_8$ are independently selected aryl or heteroaryl groups, which may contain additional fused rings and provided that two aryl or heteroaryl rings may be joined by ring fusion, m is 0 or 1. In one embodiment, $Ar_1$, each $Ar_2$, and $Ar_3$ through $Ar_8$ represent phenylene or phenyl groups.

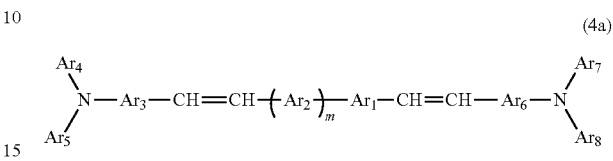

(4a)

Illustrative examples of useful styrylamines that are blue or blue green emitters listed below.

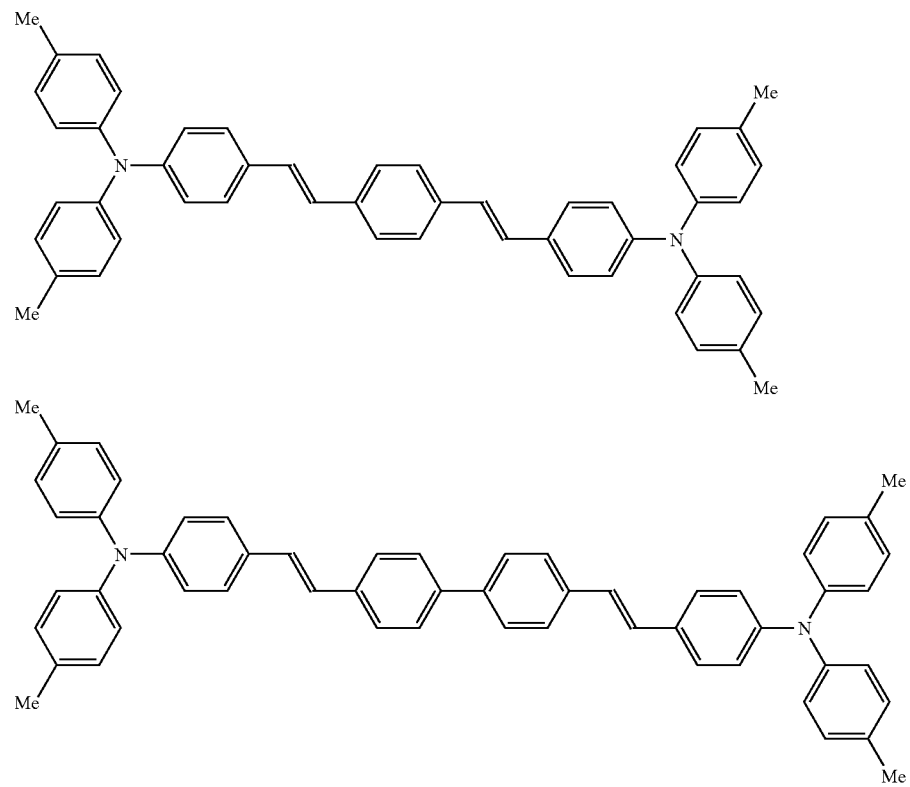

Commonly assigned Ser. No. 10/977,839, filed Oct. 29, 2004 entitled Organic Element for Electroluminescent Devices by Margaret J. Helber, et al., which is incorporated herein by reference, describes additional useful styrylarene blue and blue-green light-emitting materials. Useful light-emitting materials are represented by Formula (4b).

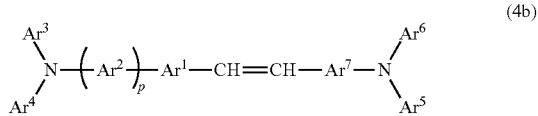

(4b)

In Formula (4b), $Ar^1$, each $Ar^2$, and $Ar^7$ may be the same or different and each represents a divalent aromatic group. Illustrative examples of such groups include a phenylene group, a naphthylene group, a quinolindiyl group and a thiendiyl group. $Ar^3$, $Ar^4$, $Ar^5$, and $Ar^6$ may be the same or different and each represents an aromatic group such as phenyl group, a fused aromatic ring group such as naphthyl, anthranyl or phenanthryl group, a heterocyclic aromatic ring group or monovalently linked aromatic ring groups such as a biphenyl group. Additionally $Ar^3$ and $Ar^4$, as well as $Ar^5$ and $Ar^6$ may be joined directly or through additional atoms to form a carbocyclic or heterocyclic ring. In the Formula, p is 1, 2, or 3. Illustrative examples of useful materials are shown below.

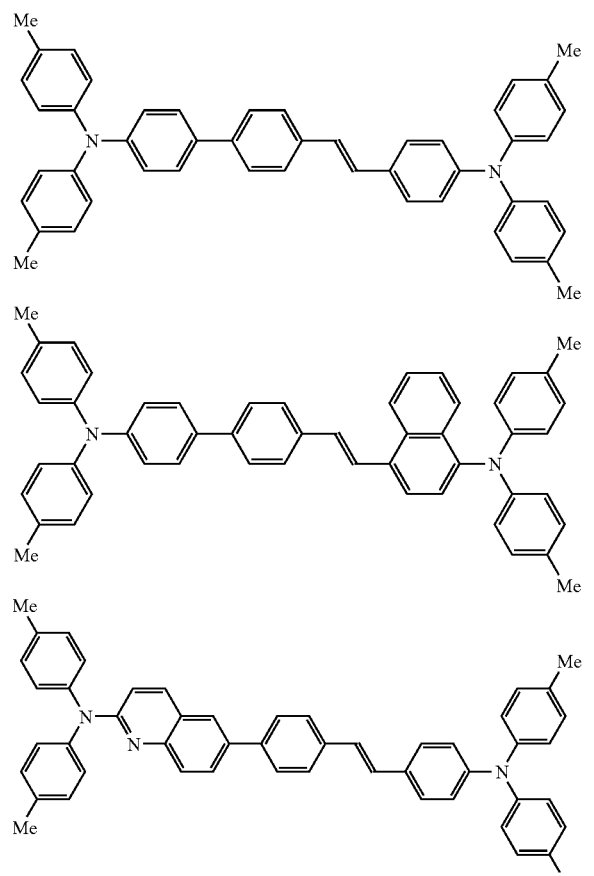

Another useful class of emitters comprise a boron atom. Desirable light-emitting materials that contain boron include those described in US 2003/0198829, US 2003/0201415 and US 2005/0170204, which are incorporated herein by reference. Suitable light-emitting materials, including those that emit blue or blue-green light, are represented by the structure Formula (5).

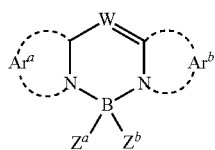

In Formula (5), $Ar^a$ and $Ar^b$ independently represent the atoms necessary to form a five or six-membered aromatic ring group, such as a pyridine group. $Z^a$ and $Z^b$ represent independently selected substituents, such as fluoro substituents. In Formula (5), W represents N or C—Y, wherein Y represents hydrogen or a substituent, such as an aromatic group, such as a phenyl group or a tolyl group, an alkyl group, such as a methyl group, a cyano substituent, or a trifluoromethyl substituent.

Illustrative examples of useful boron-containing fluorescent materials are listed below.

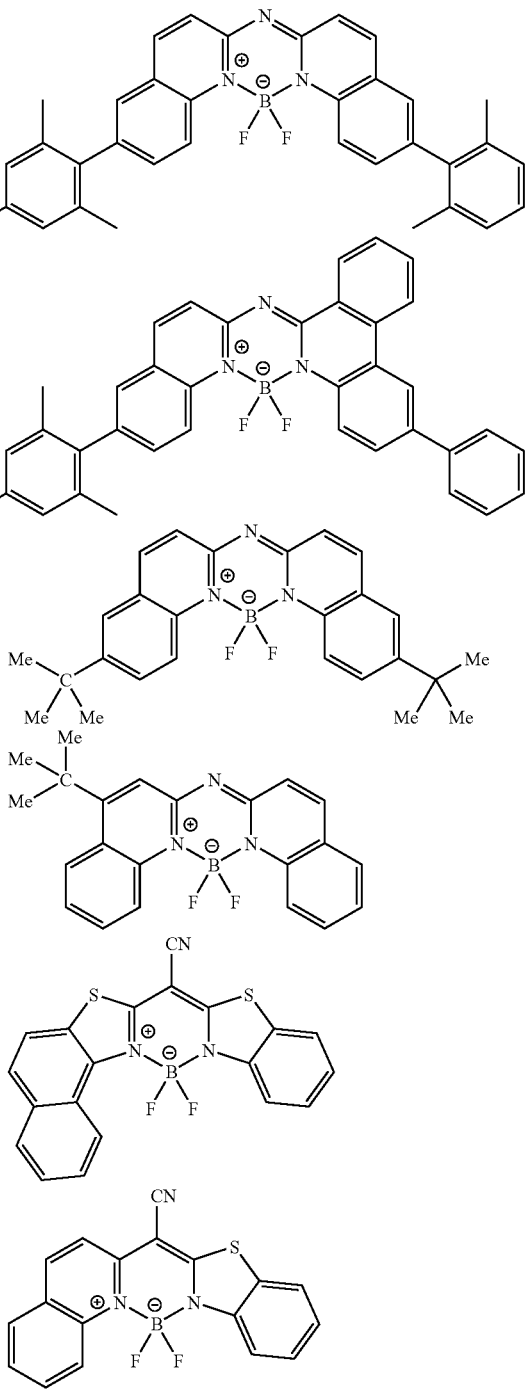

In another embodiment, the light-emitting layer emits green light. A particularly useful class of green light-emitting material includes quinacridone compounds such as those represented by Formula (6). Suitable quinacridones are described US 2004/0001969, U.S. Pat. Nos. 6,664,396, 5,593,788, and JP 09-13026.

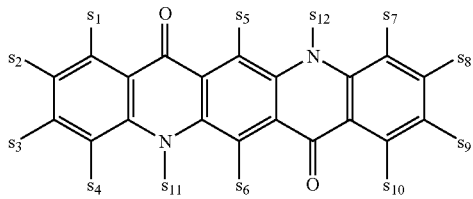

(6)

In Formula (6), $s_1$-$s_{10}$ independently represent hydrogen or an independently selected substituent, such as a phenyl group, a tolyl group, a halogen such as F, or an alkyl group, such as a methyl group. Adjacent substituents may combine to form rings, such as fused benzene ring groups.

In Formula (6), $s_{11}$ and $s_{12}$ independently represent an alkyl group or an aromatic group. In one suitable embodiment, $s_{11}$ and $s_{12}$ independently represent a phenyl ring group, such as a phenyl ring or a tolyl ring.

Illustrative examples of useful quinacridone compounds are shown below.

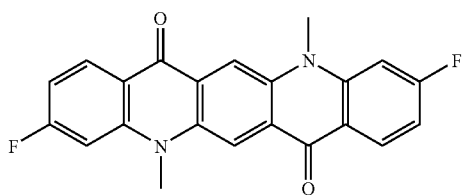

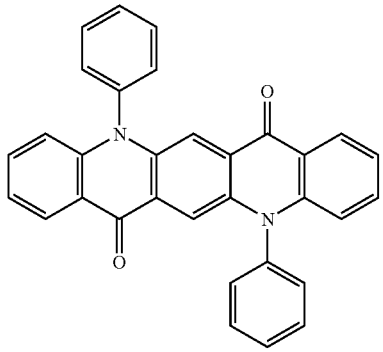

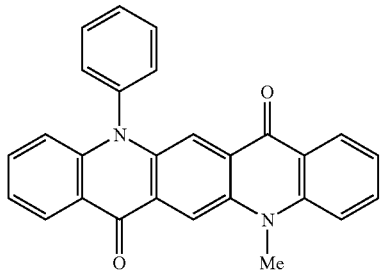

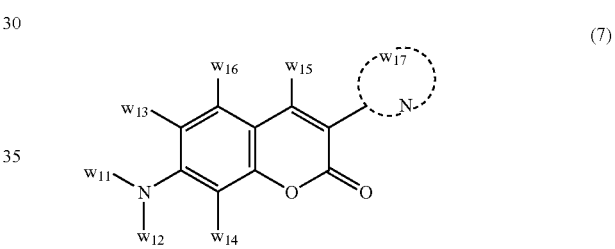

Another useful class of green light-emitting materials includes coumarin compounds such as those represented by Formula (7). Suitable coumarins are described by Tang et al., U.S. Pat. Nos. 4,769,292 and 6,020,078.

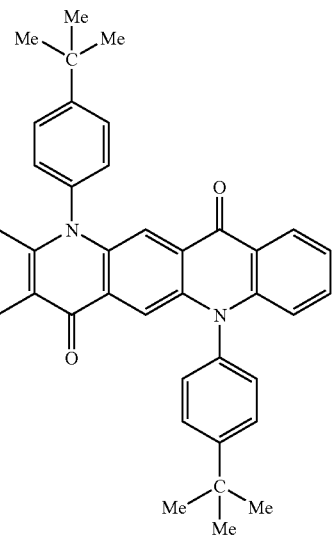

(7)

In Formula (7), $w_{11}$ and $w_{12}$ represent an independently selected substituent, such as an alkyl group or aryl group, provided $w_{11}$ and $w_{12}$ may combine with each other or with $w_{13}$ and $w_{14}$ to form rings. Desirably $w_{11}$ and $w_{12}$ represent independently selected alkyl groups, provided $w_{11}$ and $w_{12}$ may combine with each other or with $w_{13}$ and $w_{14}$ to form saturated rings. In Formula (5), $w_{13}$-$w_{16}$ independently represent hydrogen or an independently selected substituent, such as phenyl ring group or a methyl group. Adjacent substituents may combine to form rings, such as fused benzene rings. In Formula (7), $w_{17}$ represents the atoms necessary to complete a heteroaromatic ring, such as a benzothiazole ring group. Illustrative examples of useful coumarin compounds are shown below.

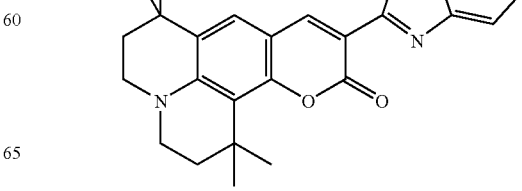

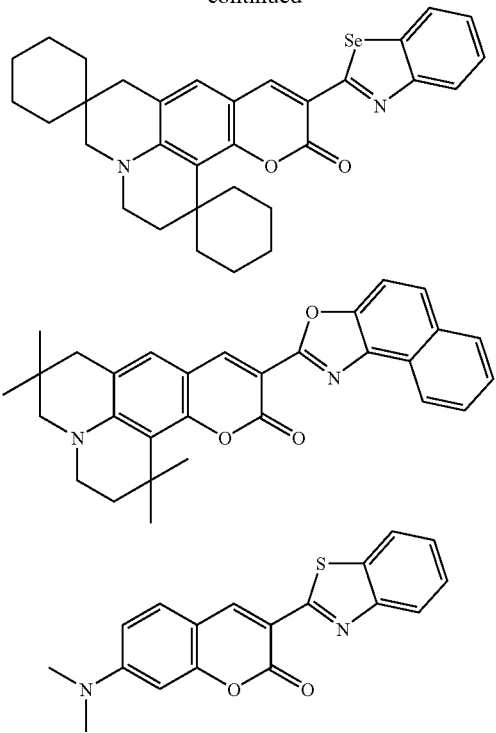

Examples of additional useful emitting materials include derivatives of anthracene, fluorene, periflanthene, and indenoperylene.

In one embodiment, a useful device includes one layer including a light-emitting material that emits blue or blue-green light and an additional layer emits yellow or red light and contains a of rubrene derivative.

In another embodiment of the invention, when additional layers are present so that the emitted light is white, a filter capable of controlling the spectral components of the white light such as red, green and blue, can be placed over-lying the device to give a device useful for color display.

The thickness of the LEL is often in the range of 5 to 50 nm, frequently in the range of 10 to 40 nm, and commonly in the range of 20 to 30 nm Unless otherwise specifically stated, use of the term "substituted" or "substituent" means any group or atom other than hydrogen. Additionally, unless otherwise specifically stated, when a compound with a substitutable hydrogen is identified or the term "group" is used, it is intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy) ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy) acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure, especially useful for of a small molecule device, is shown in the FIGURE and is comprised of a substrate 101, an anode 103, a hole-injecting layer 105, a hole-transporting layer 107, a light-emitting layer 109, an electron-transporting layer 110, an electron-injecting layer 111, an optional second electron-injecting layer 112 and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, the transmissive characteristics of the anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0891121 and EP1029909.

Additional useful hole-injecting materials are described in U.S. Pat. No. 6,720,573. For example, the material below may be useful for such purposes.

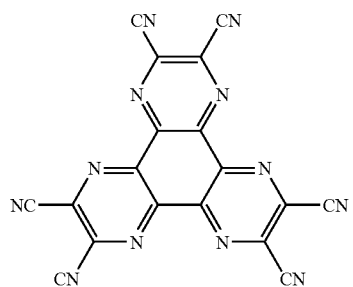

Hole-Transporting Layer (HTL)

The hole-transporting layer 107 of the organic EL device contains at least one hole-transporting compound, such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula (A).

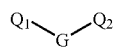

A

In Formula (A), $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalenediyl moiety.

A useful class of triarylamines satisfying structural Formula (A) and containing two triarylamine moieties is represented by structural Formula (B).

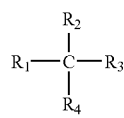

B

In Formula (B), $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural Formula (C).

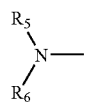

C

In Formula (C), $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula (C), linked through an arylene group. Useful tetraaryldiamines include those represented by Formula (D).

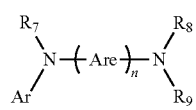

D

In Formula (D), each Are is an independently selected arylene group, such as a phenylene, naphthylenediyl or anthracenediyl moiety and n is an integer of from 1 to 4. Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae (A), (B), (C), (D), can each in turn be substituted. Typical substituents include alkyl groups, alkoxy groups, aryl groups, aryloxy groups, benzo and halogen such as fluoride. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane (TAPC)
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

Another class of useful hole-transporting materials includes polycyclic aromatic compounds as described in EP 1,009,041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

Useful light-emitting layers have been described previously. More than one LEL may be present. As more fully described in U.S. Pat. Nos. 4,769,292 and 5,935,721, the additional light-emitting layers (LEL) of the organic EL element may include a luminescent fluorescent or phosphorescent material where electroluminescence is produced as a result of electron-hole pair recombination in this region. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

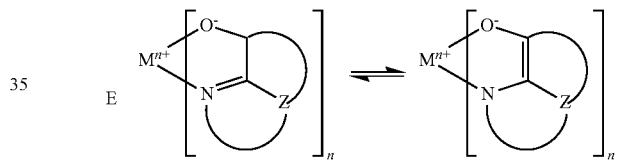

E

In Formula (E), M represents a metal; n is an integer of from 1 to 4; and Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III); Alq]
CO-2: Magnesium bisoxine [alias, bis(8-quinolinolato)magnesium(II)]
CO-3: Bis[benzo {f}-8-quinolinolato]zinc (II)
CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)].

As described previously, derivatives of anthracene (Formula F) constitute one class of useful host materials capable of supporting electroluminescence, and are particularly suitable for light emission of wavelengths longer than 400 nm, e.g., blue, green, yellow, orange or red. Asymmetric anthracene derivatives as disclosed in U.S. Pat. No. 6,465,115 and WO 2004/018587 are also useful hosts.

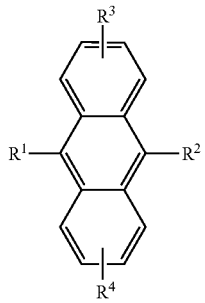

F

In Formula (F), $R^1$ and $R^2$ represent independently selected aryl groups, such as naphthyl, phenyl, biphenyl, triphenyl, anthracene. $R^3$ and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine or cyano.

A useful class of anthracenes are derivatives of 9,10-di-(2-naphthyl)anthracene (Formula G).

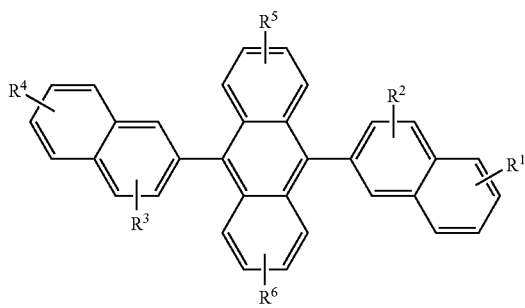

G

In Formula (G), $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine or cyano.

Illustrative examples of useful anthracene materials have been previously described.

Benzazole derivatives (Formula H) constitute another class of useful host materials capable of supporting electroluminescence, and are particularly suitable for light emission of wavelengths longer than 400 nm, e.g., blue, green, yellow, orange or red.

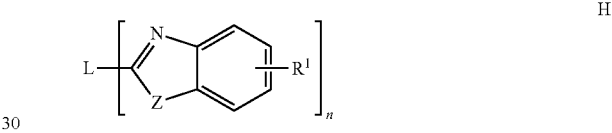

H

In Formula H, n is an integer of 3 to 8; Z is O, NR or S; and R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring. L is a linkage unit consisting of alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Distyrylarylene derivatives are also useful hosts, as described in U.S. Pat. No. 5,121,029. Carbazole derivatives are particularly useful hosts for phosphorescent emitters.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Examples of useful phosphorescent materials are reported in WO 00/57676, WO 00/70655, WO 01/41512, WO 02/15645, US 2003/0017361, WO 01/93642, WO 01/39234, U.S. Pat. No. 6,458,475, WO 02/071813, U.S. Pat. No. 6,573,651, US 2002/0197511, WO 02/074015, U.S. Pat. No. 6,451,455, US 2003/0072964, US 2003/0068528, U.S. Pat. Nos. 6,413,656, 6,515,298, 6,451,415, 6,097,147, US 2003/0124381, US 2003/0059646, US 2003/0054198, EP 1 239 526, EP 1 238 981, EP 1 244 155, US 2002/0100906, US 2003/0068526, US 2003/0068535, JP 2003073387, JP 2003073388, US 2003/0141809, US 2003/0040627, JP 2003059667, JP 2003073665, and US 2002/0121638.

Illustrative examples of useful fluorescent and phosphorescent emitting materials include, but are not limited to, the following compounds.
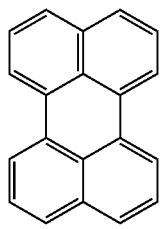
L1
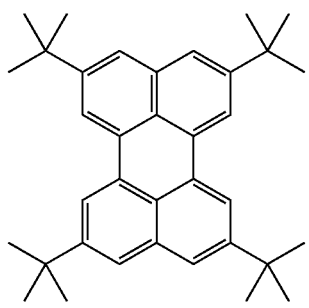
L2
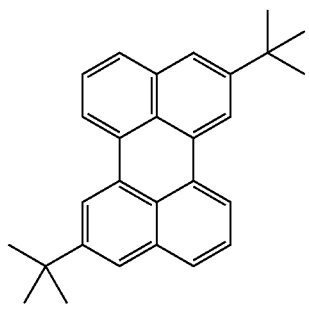
L3
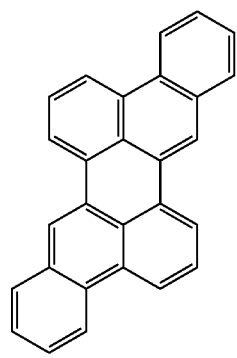
L4
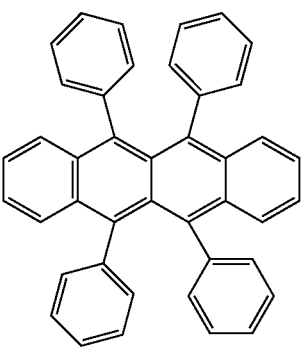
L5
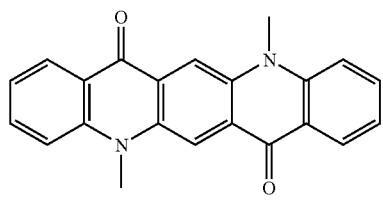
L6
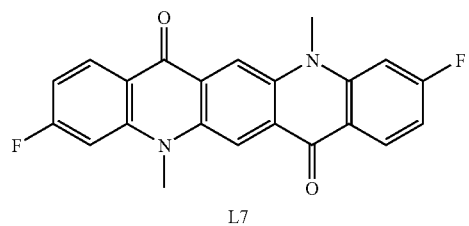 [SMILES: Cn1c2cc(F)ccc2c(=O)c2cc3c(cc21)c(=O)c1ccc(F)cc1n3C]
L7
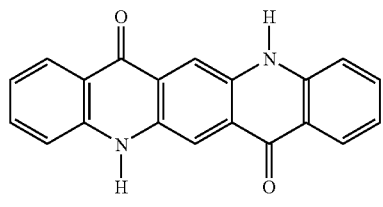
L8
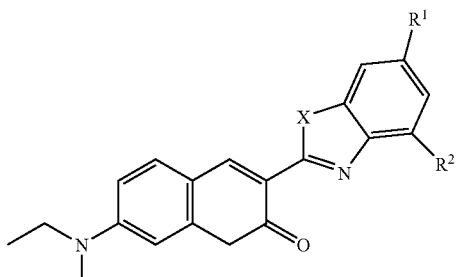
| | X | R1 | R2 |
|---|---|---|---|
| L9 | O | H | H |
| L10 | O | H | Methyl |
| L11 | O | Methyl | H |

|     | X | R1 | R2 |
|-----|---|----|----|
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

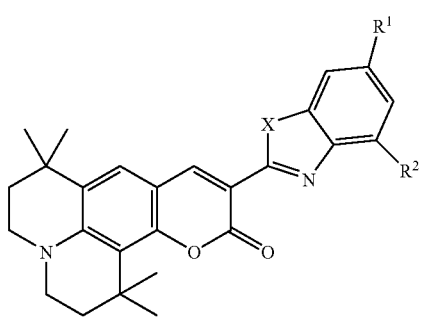

|     | X | R1 | R2 |
|-----|---|----|----|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

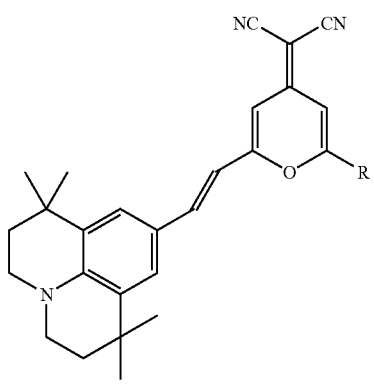

|     | R |
|-----|---|
| L37 | phenyl |
| L38 | methyl |
| L39 | t-butyl |
| L40 | mesityl |

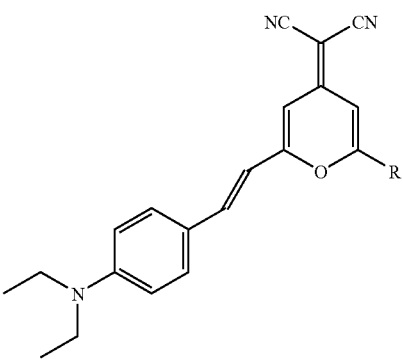

|     | R |
|-----|---|
| L41 | phenyl |
| L42 | methyl |
| L43 | t-butyl |
| L44 | mesityl |

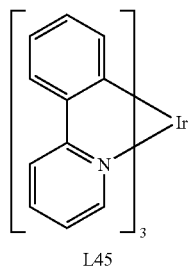

L45

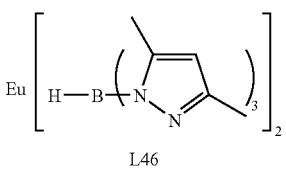

L46

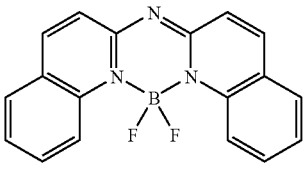
L50
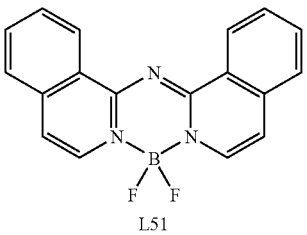
L51
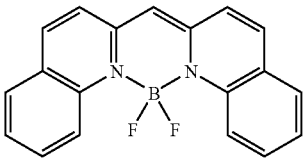
L52
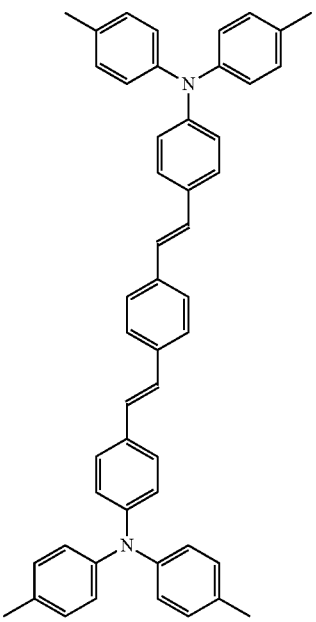
L47
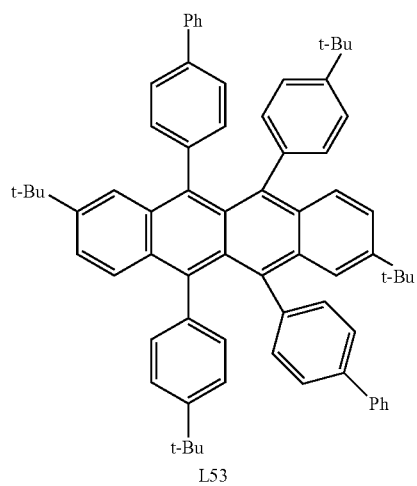 [SMILES: CC(C)(C)c1ccc(-c2c3ccc(C(C)(C)C)cc3c(-c3ccc(-c4ccccc4)cc3)c3c(-c4ccc(C(C)(C)C)cc4)c4ccc(C(C)(C)C)cc4c(-c4ccc(-c5ccccc5)cc4)c23)cc1]
L53
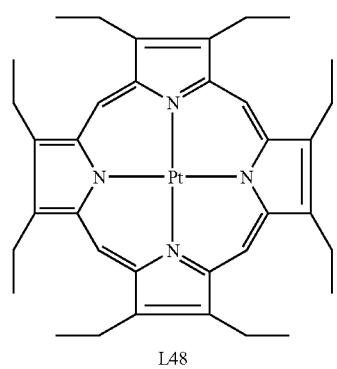
L48
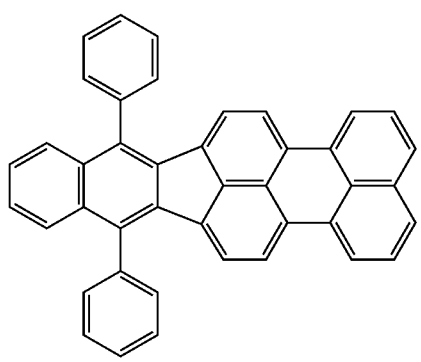
L49
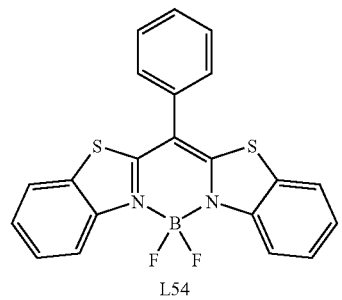
L54

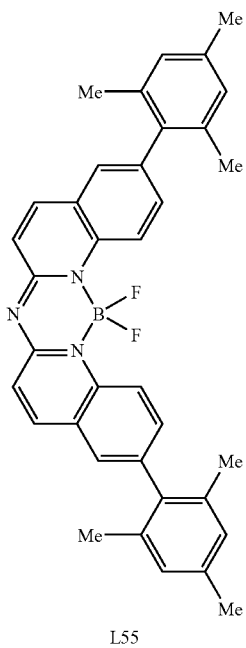

L55

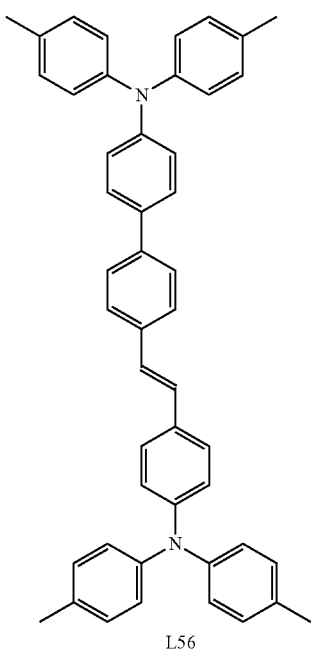

L56

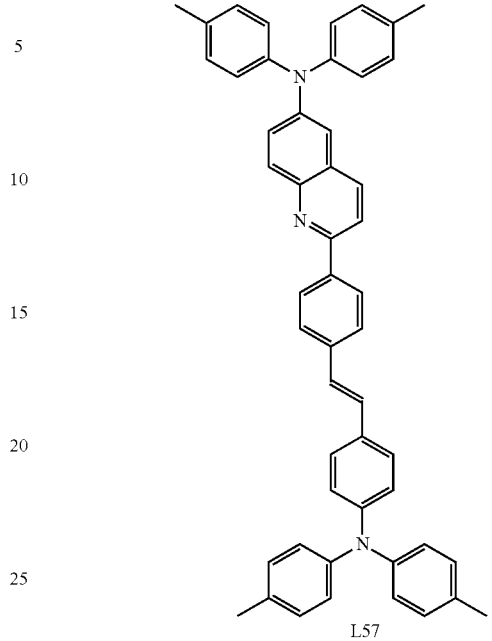

L57

Electron-Transporting Layer (ETL)

Useful electron-transport layers have been described previously. There may be more than one ETL present. Preferred thin film-forming materials for use in forming additional electron-transporting layers of the organic EL devices of this invention include metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (H) are also useful electron transporting materials. Triazines are also known to be useful as electron transporting materials. Further useful materials are silacyclopentadiene derivatives described in EP 1,480,280; EP 1,478,032; and EP 1,469,533. Substituted 1,10-phenanthroline compounds such as are disclosed in JP2003-115387; JP2004-311184; JP2001-267080; and WO2002-043449. Triazines are also known to be useful as electron transporting materials.

Electron-Injecting Layer (EIL)

Useful electron-injecting layers have also been described previously. More than one electron-injecting layer may be present. Additional electron-injecting layers, when present, include those described in U.S. Pat. Nos. 5,608,287; 5,776,622; 5,776,623; 6,137,223; and 6,140,763, 6,914,269 the disclosures of which are incorporated herein by reference. A useful additional electron-injecting layer generally consists of a material having a work function less than 4.0 eV. A thin-film containing low work-function alkaline metals or alkaline earth metals, such as Li, Cs, Ca, Mg can be employed. In addition, an organic material doped with these low work-function metals can also be used effectively as the electron-injecting layer. Examples are Li- or Cs-doped Alq. In one suitable embodiment an additional electron-injecting layer includes LiF. In practice, the additional electron-injecting layer is often a thin layer deposited to a suitable thickness in a range of 0.1-3.0 nm.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Useful Organic Layers and Device Architecture In some instances, layers 109 and 111 can optionally be collapsed into a single layer that serves the function of supporting both light emission and electron transportation. It also known in the art that emitting materials may be included in the hole-transporting layer, which may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182 and may be equipped with a suitable filter arrangement to produce a color emission.

Additional layers such as electron or hole-blocking layers as taught in the art may be employed in devices of this invention. Hole-blocking layers may be used between the light emitting layer and the electron transporting layer. Electron-blocking layers may be used between the hole-transporting layer and the light emitting layer. These layers are commonly used to improve the efficiency of emission, for example, as in US 20020015859.

This invention may be used in so-called stacked device architecture, for example, as taught in U.S. Pat. Nos. 5,703,436 and 6,337,492.

Deposition of Organic Layers

The organic materials mentioned above are suitably deposited by any means suitable for the form of the organic materials. In the case of small molecules, they are conveniently deposited through sublimation, but can be deposited by other means such as from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. Nos. 10/784,585; 10/805,980; 10/945,940; 10/945,941; 11/050,924; and 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Example 1. Electrochemical Redox Potentials and Estimated Energy Levels

LUMO and HOMO values are typically estimated experimentally by electrochemical methods. The following method illustrates a useful means to measure redox properties. A Model CHI660 electrochemical analyzer (CH Instruments, Inc., Austin, Tex.) was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 cm$^2$) was used as working electrode. The GC electrode was polished with 0.05 μm alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard ($E_{Fc}$=0.50 V vs. SCE in 1:1 acetonitrile/toluene, 0.1 M TBAF). A mixture of acetonitrile and toluene (50%/50% v/v, or 1:1) was used as the organic solvent system. The supporting electrolyte, tetrabutylammonium tetrafluoroborate (TBAF) was recrystallized twice in isopropanol and dried under vacuum. All solvents used were low water grade (<20 ppm water). The testing solution was purged with high purity nitrogen gas for approximately 5 minutes to remove oxygen and a nitrogen blanket was kept on the top of the solution during the course of the experiments. All measurements were performed at ambient temperature of 25±1° C. The oxidation and reduction potentials were determined either by averaging the anodic peak potential (Ep,a) and cathodic peak potential (Ep,c) for reversible or quasi-reversible electrode processes or on the basis of peak potentials (in SWV) for irreversible processes. LUMO and HOMO values are calculated from the following:

Formal reduction potentials vs. SCE for reversible or quasi-reversible processes;

$$E^{o'}_{red}=(E_{pa}+E_{pc})/2$$

$$E^{o'}_{ox}=(E_{pa}+E_{pc})/2$$

Formal reduction potentials vs. Fc;

$$E^{o'}_{red} \text{ vs. } Fc=(E^{o'}_{red} \text{ vs. } SCE)-E_{Fc}$$

$$E^{o'}_{ox} \text{ vs. } Fc=(E^{o'}_{ox} \text{ vs. } SCE)-E_{Fc}$$

where $E_{Fc}$ is the oxidation potential $E_{ox}$ of ferrocene;

Estimated lower limit for LUMO and HOMO values;

$$LUMO=HOMO_{Fc}-(E^{o'}_{red} \text{ vs. } Fc)$$

$$HOMO=HOMO_{Fc}-(E^{o'}_{ox} \text{ vs. } Fc)$$

where $HOMO_{Fc}$ (Highest Occupied Molecular Orbital for ferrocene)=−4.8 eV.

Redox potentials as well as estimated HOMO and LUMO values are summarized in Table 1.

TABLE 1

Redox Potentials and Estimated Energy Levels.

| Compound | $E^{o'}$(ox) V vs. SCE | $E^{o'}$(red) V vs. SCE | $E^{o'}$(red) V vs. FC | HOMO (eV) | LUMO (eV) |
|---|---|---|---|---|---|
| I-1 | 1.285 | −1.779 | −2.279 | −5.58 | −2.52 |
| I-2 | 1.297 | −1.78 | −2.28 | −5.60 | −2.52 |
| I-3 | 1.265 | −1.796 | −2.296 | −5.56 | −2.50 |
| I-4 | 1.267 | −1.797 | −2.297 | −5.57 | −2.50 |
| I-5 | 1.25[a] | −1.71[a] | −2.21 | −5.55 | −2.59 |
| I-21 | 1.254 | −1.903 | −2.399 | −5.56 | −2.40 |
| I-23 | 1.308 | −1.855 | −2.355 | −5.61 | −2.44 |
| Bphen | 1.8[b] | −1.9[b] | −2.4 | −6.1 | −2.4 |

[a]Estimated from SWV at 15 Hz.
[b]Oxidation was irreversible.

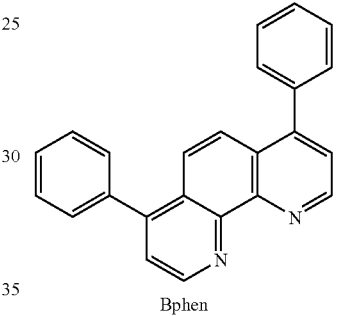

Bphen

The LUMO value of compounds of interest can also be estimated from molecular orbital calculations. Typical calculations are carried out by using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland, Oreg.) computer code. Calculations provide the energy level of the highest occupied molecular orbital (HOMO) and lowest unoccupied molecular orbital (LUMO) in Hartree units where 1 Hartree unit is 27.21 eV.

Example 2. Fabrication of Device 1-1 Through 1-11

A series of EL devices (1-1 through 1-11) were constructed as described below.

1. A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.

2. Over the ITO was deposited a 1 nm fluorocarbon (CFx) hole-injecting layer (HIL) by plasma-assisted deposition of CHF₃ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A light-emitting layer (LEL) corresponding to a host material I-1 and including light-emitting material, D-1, at level of 0.75% of the layer by volume was deposited to a thickness of 20.0 nm over the HTL.
5. An electron-transporting layer (ETL) composed of rubrene or I-1 (see Table 2a) was vacuum-deposited over the LEL. The thickness of the ETL is also listed in Table 2a.
6. An electron-injecting layer (EIL) composed of Bphen was deposited over the ETL to a thickness shown in Table 2a.
7. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment.

TABLE 2a

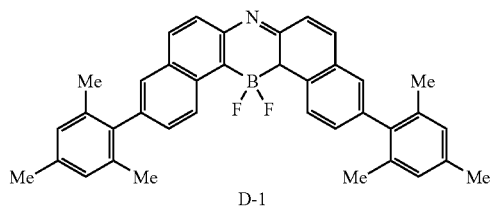

D-1

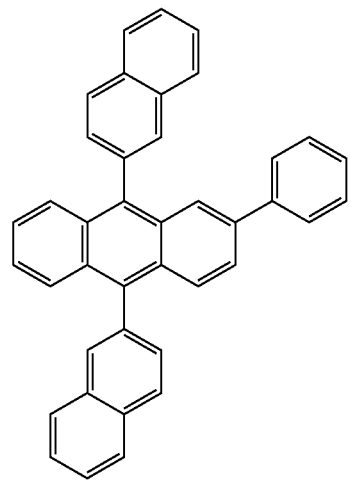

I-1

TABLE 2a-continued

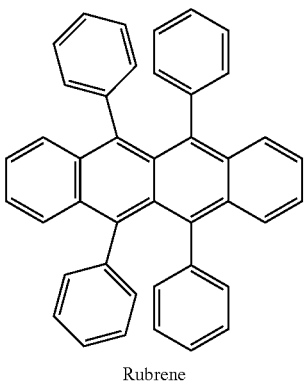 [SMILES: c1ccc(-c2c3ccccc3c(-c3ccccc3)c3c(-c4ccccc4)c4ccccc4c(-c4ccccc4)c23)cc1]

Rubrene

LEL, ETL AND EIL of device 1-1 through 1-11.

| Device | Example | LEL Thick. (nm) | ETL Material | ETL Thick. (nm) | EIL Material | EIL Thick. (nm) | EIL/LEL Ratio |
|---|---|---|---|---|---|---|---|
| 1-1 | Comparative | 20.0 | Rubrene | 34.5 | Bphen | 0.5 | 0.025 |
| 1-2 | Comparative | 20.0 | Rubrene | 34.0 | Bphen | 1.0 | 0.050 |
| 1-3 | Comparative | 20.0 | Rubrene | 33.0 | Bphen | 2.0 | 0.100 |
| 1-4 | Comparative | 20.0 | Rubrene | 30.0 | Bphen | 5.0 | 0.250 |
| 1-5 | Comparative | 20.0 | Rubrene | 25.0 | Bphen | 10.0 | 0.500 |
| 1-6 | Comparative | 20.0 | Rubrene | 20.0 | Bphen | 15.0 | 0.750 |
| 1-7 | Comparative | 20.0 | I-1 | 33.0 | Bphen | 2.0 | 0.100 |
| 1-8 | Inventive | 20.0 | I-1 | 30.0 | Bphen | 5.0 | 0.250 |
| 1-9 | Inventive | 20.0 | I-1 | 25.0 | Bphen | 10.0 | 0.500 |
| 1-10 | Inventive | 20.0 | I-1 | 20.0 | Bphen | 15.0 | 0.750 |
| 1-11 | Inventive | 20.0 | I-1 | 15.0 | Bphen | 20.0 | 1.000 |

The devices were tested for luminous efficiency at an operating current of 20 mA/cm² and the results are reported in Table 2b in the form of luminous yield (cd/A) and efficiency (w/A), and power efficiency (lm/watt). Device efficiency is the radiant flux (in watts) produced by the device per amp of input current, where radiant flux is the light energy produced by the device per unit time. Light intensity is measured perpendicular to the device surface, and it is assumed that the angular profile is Lambertian. Drive voltage is reported in volts and is corrected for the ITO voltage drop.

TABLE 2b

Testing results for device 1-1 through 1-11.

| Device | Example Type | Voltage[1] (V) | Luminance Yield (cd/A) | Efficiency (W/A) | Power Efficiency (lm/W) |
|---|---|---|---|---|---|
| 1-1 | Comparative | 4.44 | 1.33 | 0.033 | 0.94 |
| 1-2 | Comparative | 3.85 | 2.44 | 0.059 | 1.99 |
| 1-3 | Comparative | 3.61 | 2.74 | 0.066 | 2.39 |
| 1-4 | Comparative | 3.35 | 2.68 | 0.063 | 2.52 |
| 1-5 | Comparative | 3.27 | 2.88 | 0.067 | 2.77 |
| 1-6 | Comparative | 3.89 | 2.84 | 0.068 | 2.30 |
| 1-7 | Comparative | 4.56 | 3.73 | 0.094 | 2.56 |
| 1-8 | Inventive | 3.18 | 6.11 | 0.149 | 6.03 |
| 1-9 | Inventive | 3.04 | 6.37 | 0.151 | 6.58 |
| 1-10 | Inventive | 3.03 | 5.80 | 0.136 | 6.01 |
| 1-11 | Inventive | 3.14 | 6.18 | 0.145 | 6.18 |

[1]Corrected by subtracting the measured ITO voltage drop.

The results in Table 2b indicate that inventive devices (1-8 through 1-11), which include an anthracene derivative (I-1) in the electron transport layer, provide both lower voltage and higher efficiency than the comparative devices, which include a naphthacene material (rubrene) in the ETL. The ratio of the thickness of the EIL layer to the thickness of the LEL is also critical. Comparative device 1-7, having a low EIL/LEL ratio, provides much higher voltage and lower efficiency than devices 1-8 through 1-11 having a more optimum EIL/LEL ratio.

Example 3. Fabrication of Device 2-1 Through 2-12

A series of EL devices (2-1 through 2-12) were constructed in the same manner as device 1-1, as described below.

1. A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A light-emitting layer (LEL) corresponding to a host material I-1, TBADN or Alq and including light-emitting material D-1 or D-2 was deposited to a thickness of either 20 nm or 40 nm over the HTL. See Table 3a for a description of the LEL host, dopant, and thickness of each device.
5. An electron-transporting layer (ETL) composed of I-1 or TBADN (see Table 3a) was vacuum-deposited over the LEL. The thickness of the ETL was 25 nm.
6. An electron-injecting layer (EIL) composed of Bphen was deposited over the ETL to a thickness of 10 nm.
7. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment.

TABLE 3

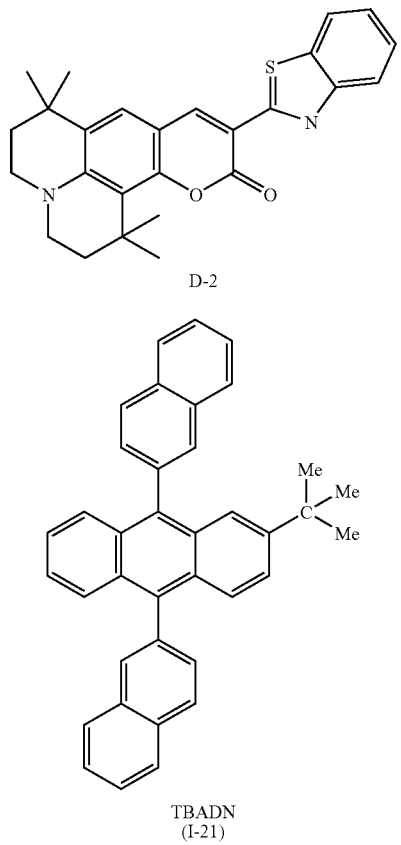

D-2

TBADN
(I-21)

LEL and ETL of device 3-1 through 3-12.

| Device | Example | LEL Host | LEL Thick. (nm) | LEL Dopant | ETL Material | EIL Thick. (nm) | EIL/LEL Ratio |
|---|---|---|---|---|---|---|---|
| 2-1 | Inventive | I-1 | 20.0 | D-1 | I-1 | 10.0 | 0.50 |
| 2-2 | Inventive | I-1 | 20.0 | D-1 | TBADN | 10.0 | 0.50 |
| 2-3 | Inventive | I-1 | 40.0 | D-1 | I-1 | 10.0 | 0.25 |
| 2-4 | Inventive | I-1 | 40.0 | D-1 | TBADN | 10.0 | 0.25 |
| 2-5 | Inventive | TBADN | 20.0 | D-1 | I-1 | 10.0 | 0.50 |
| 2-6 | Inventive | TBADN | 20.0 | D-1 | TBADN | 10.0 | 0.50 |
| 2-7 | Inventive | TBADN | 40.0 | D-1 | I-1 | 10.0 | 0.25 |
| 2-8 | Inventive | TBADN | 40.0 | D-1 | TBADN | 10.0 | 0.25 |
| 2-9 | Inventive | Alq | 20.0 | D-2 | I-1 | 10.0 | 0.50 |
| 2-10 | Inventive | Alq | 20.0 | D-2 | TBADN | 10.0 | 0.50 |
| 2-11 | Inven- | Alq | 40.0 | D-2 | I-1 | 10.0 | 0.25 |

TABLE 3-continued

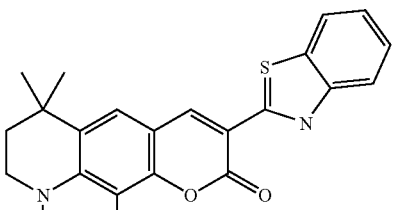

D-2

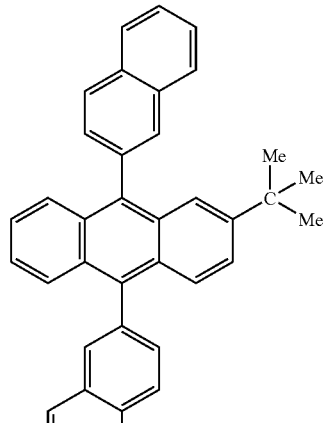

TBADN
(I-21)

LEL and ETL of device 3-1 through 3-12.

| Device | Example | LEL Host | LEL Thick. (nm) | LEL Dopant | ETL Material | EIL Thick. (nm) | EIL/LEL Ratio |
|---|---|---|---|---|---|---|---|
| 2-12 | Inventive | Alq | 40.0 | D-2 | TBADN | 10.0 | 0.25 |

The devices were tested in the same manner as device 1-1 and the results are given in Table 3b.

TABLE 3b

Testing results for device 2-1 through 2-12.

| Device | Example Type | Voltage[1] (V) | Luminance Yield (cd/A) | Efficiency (W/A) | Power Efficiency (lm/W) |
|---|---|---|---|---|---|
| 2-1 | Inventive | 3.07 | 5.73 | 0.134 | 5.86 |
| 2-2 | Inventive | 4.19 | 2.98 | 0.076 | 2.23 |
| 2-3 | Inventive | 3.41 | 5.82 | 0.112 | 5.37 |
| 2-4 | Inventive | 5.30 | 3.59 | 0.078 | 2.14 |
| 2-5 | Inventive | 3.44 | 2.94 | 0.083 | 2.69 |
| 2-6 | Inventive | 3.67 | 2.82 | 0.084 | 2.41 |
| 2-7 | Inventive | 4.31 | 3.14 | 0.081 | 2.29 |
| 2-8 | Inventive | 4.62 | 3.23 | 0.088 | 2.20 |
| 2-9 | Inventive | 3.15 | 8.11 | 0.053 | 8.09 |
| 2-10 | Inventive | 3.65 | 7.76 | 0.051 | 6.67 |
| 2-11 | Inventive | 3.97 | 9.44 | 0.060 | 7.48 |
| 2-12 | Inventive | 4.63 | 9.64 | 0.062 | 6.54 |

[1]Corrected by subtracting the measured ITO voltage drop.

This example illustrates the relative device performance when an anthracene compound bearing aromatic groups in the 2-, 9-, and 10-positions, such as I-1, is included in the electron transport layer versus the case when the anthracene bears aromatic groups in the 9- and 10-position and an alkyl group in the 2-position (TBADN). Although all the devices provide good luminance and relatively low voltage, devices with an ETL including a anthracene compound bearing aromatic groups in the 2-, 9-, and 10-positions are especially desirable.

Example 4. Fabrication of Device 3-1 Through 3-6

A series of EL devices (3-1 through 3-6) were constructed in a manner similar to device 1-1 as described below.

1. A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A light-emitting layer (LEL) corresponding to a host material I-1, and including light-emitting material D-3 at a level of 1.5% by volume, was deposited to a thickness of 20 nm over the HTL.
5. An electron-transport layer (ETL) composed of the material I-1 was vacuum-deposited over the LEL. The thickness of the ETL is reported in Table 4a.
6. An electron-injecting layer (EIL) composed of Bphen was deposited over the ETL to a thickness shown in Table 4a.
7. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment. The devices were tested in the same manner as device 1-1 and the results are given in Table 4b.

TABLE 4a

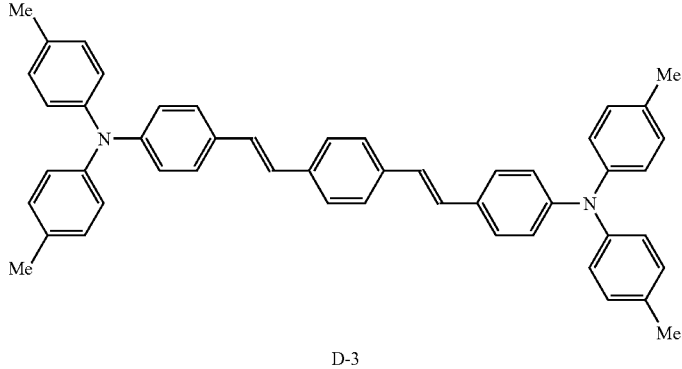

D-3

The LEL, ETL, and EIL of device 3-1 through 3-6.

| Device | Example Type | LEL Host | LEL Thick. | ETL Material | ETL Thick. (nm) | EIL Material | EIL Thick. (nm) | EIL/LEL Ratio |
|---|---|---|---|---|---|---|---|---|
| 3-1 | Comparative | I-1 | 20.0 | I-1 | 35.3 | none | — | none |
| 3-2 | Comparative | I-1 | 20.0 | none | — | Bphen | 35.6 | none |
| 3-3 | Comparative | I-1 | 20.0 | I-1 | 34.6 | Bphen | 0.9 | 0.045 |
| 3-4 | Comparative | I-1 | 20.0 | I-1 | 34.2 | Bphen | 1.4 | 0.070 |
| 3-5 | Inventive | I-1 | 20.0 | I-1 | 32.6 | Bphen | 3.1 | 0.155 |
| 3-6 | Inventive | I-1 | 20.0 | I-1 | 25.3 | Bphen | 10.6 | 0.530 |

TABLE 4b

Testing results for device 3-1 through 3-6.

| Device | Example Type | Voltage[1] (V) | Luminance Yield (cd/A) | Efficiency (W/A) | Power Efficiency (lm/W) |
|---|---|---|---|---|---|
| 3-1 | Comparative | 10.3 | 1.33 | 0.015 | 0.41 |
| 3-2 | Comparative | 3.98 | 13.8 | 0.152 | 10.91 |
| 3-3 | Comparative | 4.97 | 14.2 | 0.155 | 8.96 |
| 3-4 | Comparative | 4.77 | 14.3 | 0.158 | 9.44 |
| 3-5 | Inventive | 3.99 | 15.6 | 0.172 | 12.27 |
| 3-6 | Inventive | 3.42 | 12.1 | 0.134 | 11.15 |

[1]Corrected by subtracting the measured ITO voltage drop.

As can be seen from Table 4b, the inventive devices 3-5 and 3-6 afford greater power efficiency than the comparatives 3-1 and 3-2, which do not include both an ETL and an EIL. The inventive devices, which have the desired EIL/LEL thickness ratio, also provide lower voltage and greater power efficiency relative to comparative 3-3 and 3-4, which do not have an EIL/LEL thickness ratio in a desirable range.

Example 5. Fabrication of Device 4-1 Through 4-12

A series of EL devices (4-1 through 4-12) were constructed in a manner similar to device 1-1, as described below.

A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.

1. Over the ITO was deposited a 1 nm fluorocarbon (CFx) hole-injecting layer (HIL) by plasma-assisted deposition of $CHF_3$ as described in U.S. Pat. No. 6,208,075.
2. Next a layer of hole-transporting material 4,4'-Bis[N-(1-naphthyl)-N-phenylamino]biphenyl (NPB) was deposited to a thickness of 75 nm.
3. A light-emitting layer (LEL) corresponding to a host material I-1, I-23 or TBADN (I-23), as shown in Table 5a and including light-emitting material D-1 at a level of 0.75% by volume, was deposited to a thickness of 20 nm over the HTL.
4. An electron-transporting layer (ETL) composed of the material I-1 was vacuum-deposited over the LEL. The thickness of the ETL is also reported in Table 5a.
5. An electron-injecting layer (EIL) composed Bphen was deposited over the ETL to a thickness shown in Table 5a.
6. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment. The devices were tested in the same manner as device 1-1 and the results are given in Table 5b.

TABLE 5a

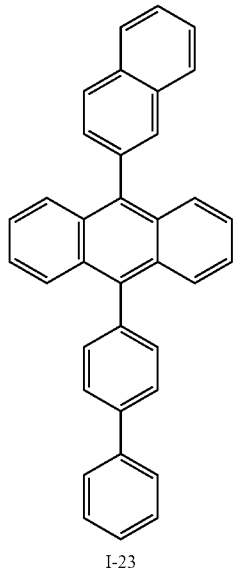

I-23

The LEL, ETL, and EIL of device 4-1 through 4-12.

| Device | Example | LEL Host | LEL Thick. (nm) | ETL Material | ETL Thick. (nm) | EIL Material | EIL Thick. (nm) | EIL/LEL Ratio |
|---|---|---|---|---|---|---|---|---|
| 4-1 | Inventive | I-1 | 20.0 | I-1 | 30.0 | Bphen | 5.0 | 0.25 |
| 4-2 | Inventive | I-1 | 20.0 | I-1 | 25.0 | Bphen | 10.0 | 0.50 |
| 4-3 | Inventive | I-1 | 20.0 | I-1 | 20.0 | Bphen | 15.0 | 0.75 |
| 4-4 | Inventive | I-1 | 20.0 | I-1 | 15.0 | Bphen | 20.0 | 1.00 |
| 4-5 | Inventive | I-23 | 20.0 | I-1 | 30.0 | Bphen | 5.0 | 0.25 |
| 4-6 | Inventive | I-23 | 20.0 | I-1 | 25.0 | Bphen | 10.0 | 0.50 |
| 4-7 | Inventive | I-23 | 20.0 | I-1 | 20.0 | Bphen | 15.0 | 0.75 |
| 4-8 | Inventive | I-23 | 20.0 | I-1 | 15.0 | Bphen | 20.0 | 1.00 |
| 4-9 | Inventive | I-21 | 20.0 | I-1 | 30.0 | Bphen | 5.0 | 0.250 |
| 4-10 | Inventive | I-21 | 20.0 | I-1 | 25.0 | Bphen | 10.0 | 0.500 |
| 4-11 | Inventive | I-21 | 20.0 | I-1 | 20.0 | Bphen | 15.0 | 0.750 |
| 4-12 | Inventive | I-21 | 20.0 | I-1 | 15.0 | Bphen | 20.0 | 1.000 |

TABLE 5b

Testing results for device 7-1 through 7-12.

| Device | Example | Voltage[1] (V) | Luminance Yield (cd/A) | Efficiency (W/A) | Power Efficiency (lm/W) |
|---|---|---|---|---|---|
| 4-1 | Inventive | 3.27 | 5.33 | 0.125 | 5.12 |
| 4-2 | Inventive | 3.07 | 4.93 | 0.113 | 5.05 |
| 4-3 | Inventive | 3.01 | 5.07 | 0.113 | 5.30 |
| 4-4 | Inventive | 3.14 | 5.16 | 0.117 | 5.16 |
| 4-5 | Inventive | 3.55 | 4.99 | 0.119 | 4.42 |
| 4-6 | Inventive | 3.30 | 4.73 | 0.112 | 4.51 |
| 4-7 | Inventive | 3.26 | 4.92 | 0.118 | 4.74 |
| 4-8 | Inventive | 3.37 | 5.08 | 0.122 | 4.75 |
| 4-9 | Inventive | 3.56 | 2.59 | 0.075 | 2.29 |
| 4-10 | Inventive | 3.47 | 2.49 | 0.072 | 2.25 |
| 4-11 | Inventive | 3.43 | 2.43 | 0.70 | 2.21 |
| 4-12 | Inventive | 3.59 | 2.39 | 0.064 | 2.09 |

[1]Corrected by subtracting the measured ITO voltage drop.

This example compares different host materials in the LEL, as well as variations in the EIL/LEL ratio. Examination of Table 5b indicates that all the devices have low voltage and good power efficiency, however, LEL host materials such as I-1, an anthracene compound bearing aromatic groups in the 2-, 9-, and 10-positions, are especially desirable.

Example 6. Fabrication of Device 5-1 Through 5-3

A series of EL devices (5-1 through 5-3) were constructed in a manner similar to device 1-1, as described below.
1. A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A light-emitting layer (LEL) corresponding to a host material I-1, and including light-emitting material D-1 at a level of 0.75% by volume, was deposited to a thickness of 20 nm over the HTL.
8. An electron-transporting layer (ETL) composed of the material I-1 was vacuum-deposited over the LEL to a thickness of 25.0 nm.

9. An electron-injecting layer (EIL) composed of Bphen, TPBI, or Liq (see Table 6a) was deposited over the ETL to a thickness of 10 nm.
10. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment. The devices were tested in the same manner as device 1-1 and the results are given in Table 6b.

TABLE 6a

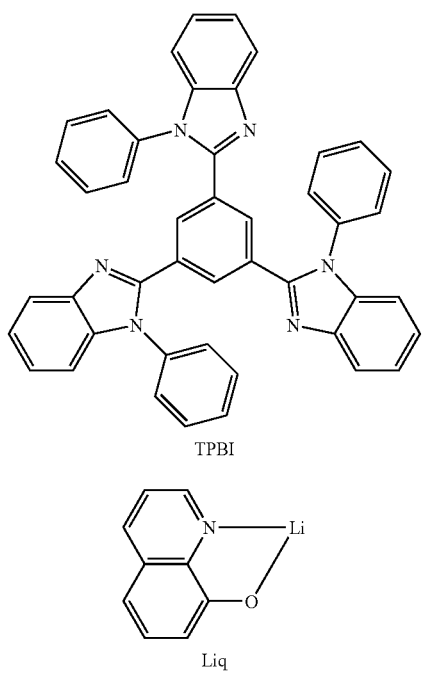

TPBI

Liq

The LEL, ETL, and EIL of device 5-1 through 5-3.

| Device | Example | LEL Host | LEL Thick. (nm) | ETL Material | EIL Material | EIL Thick. (nm) | EIL/LEL Ratio |
|---|---|---|---|---|---|---|---|
| 5-1 | Inventive | I-1 | 20.0 | I-1 | Bphen | 10.0 | 0.50 |
| 5-2 | Comparative | I-1 | 20.0 | I-1 | TPBI | 10.0 | 0.50 |
| 5-3 | Comparative | I-1 | 20.0 | I-1 | Liq | 10.0 | 0.50 |

TABLE 6b

Testing results for device 5-1 through 5-3.

| Device | Example Type | Voltage[1] (V) | Luminance Yield (cd/A) | Efficiency (W/A) | Power Efficiency (lm/W) |
|---|---|---|---|---|---|
| 5-1 | Inventive | 2.95 | 6.20 | 0.144 | 6.61 |
| 5-2 | Comparative | 5.31 | 3.65 | 0.094 | 2.16 |
| 5-3 | Comparative | 7.91 | 1.03 | 0.027 | 0.41 |

[1]Corrected by subtracting the measured ITO voltage drop.

This example illustrates the use of different materials in the EIL for devices having the same EIL/LEL thickness ratio of 0.50. The inventive device 5-1, which includes a phenanthroline material in the EIL, affords significantly lower voltage and higher efficiency than the comparative devices, 5-2 and 5-3, which contain alternative electron injection materials.

Example 7. Fabrication of Device 6-1 Through 6-3

A series of EL devices (6-1 through 6-3) were constructed in a manner similar to device 1-1, as described below.

1. A glass substrate coated with a 25 nm layer of indium-tin oxide (ITO), as the anode, was sequentially ultra-sonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A light-emitting layer (LEL) corresponding to a host material I-1, and including light-emitting material D-1 at a level of 0.75% by volume, was deposited to a thickness of 20 nm over the HTL.
5. An electron-transporting layer (ETL) composed of the material I-1 or Alq (see Table 7a) was vacuum-deposited over the LEL to a thickness of 25.0 nm.
6. An electron-injecting layer (EIL) composed of Bphen, DPBiP, or Alq (see Table 7a) was deposited over the ETL to a thickness of 10 nm.
7. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment. The devices were tested in the same manner as device 1-1 and the results are given in Table 7b.

TABLE 7a

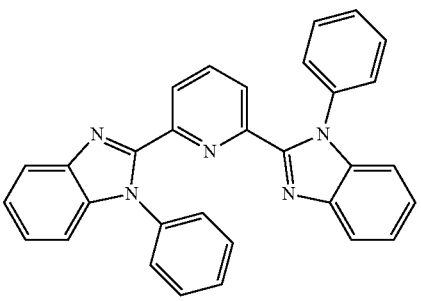

DPBiP

The LEL, ETL, and EIL of device 6-1 through 6-3.

| Device | Example | LEL Host | LEL Thick. (nm) | ETL Material | ETL Thick. (nm) | EIL Material | EIL Thick. (nm) | EIL/LEL Ratio |
|---|---|---|---|---|---|---|---|---|
| 6-1 | Inventive | I-1 | 20 | I-1 | 25 | Bphen | 10.0 | 0.50 |
| 6-2 | Comparative | I-1 | 20 | I-1 | 25 | DPBiP | 10.0 | 0.50 |

TABLE 7a-continued

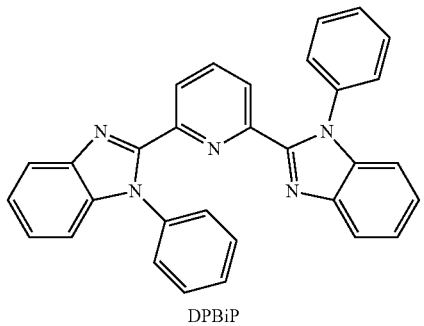

DPBiP

The LEL, ETL, and EIL of device 6-1 through 6-3.

| Device | Example | LEL Host | LEL Thick. (nm) | ETL Material | ETL Thick. (nm) | EIL Material | EIL Thick. (nm) | EIL/LEL Ratio |
|---|---|---|---|---|---|---|---|---|
| 6-3 | Comparative | I-1 | 20 | Alq | 25 | Alq | 10.0 | 0.50 |

TABLE 7b

Testing results for device 6-1 through 6-3.

| Device | Example Type | Voltage[1] (V) | Luminance Yield (cd/A) | Efficiency (W/A) | Power Efficiency (lm/W) |
|---|---|---|---|---|---|
| 6-1 | Inventive | 3.00 | 4.84 | 0.111 | 5.07 |
| 6-2 | Comparative | 4.50 | 4.14 | 0.104 | 2.89 |
| 6-3 | Comparative | 5.00 | 2.55 | 0.048 | 1.60 |

[1]Corrected by subtracting the measured ITO voltage drop.

As can be seen from Table 7b, the inventive device 6-1 affords both lower voltage and higher luminance relative to comparative device 6-2, having an EIL that does not include a phenanthroline derivative. Device 6-1 is especially advantaged over comparative device 6-3, which uses Alq in both the ETL and EIL.

Example 8. Fabrication of Device 7-1 Through 7-5

A series of EL devices (7-1 through 7-5) were constructed in a manner similar to device 1-1, as described below.

A glass substrate coated with a 25 nm layer of indium-tin oxide (ITO), as the anode, was sequentially ultrasonicated in a commercial detergent, rinsed in deionized water, degreased in toluene vapor and exposed to oxygen plasma for about 1 min.

1. Over the ITO was deposited a 1 nm fluorocarbon (CFx) hole-injecting layer (HIL) by plasma-assisted deposition of $CHF_3$ as described in U.S. Pat. No. 6,208,075.
2. Next a layer of hole-transporting material 4,4'-Bis[N-(1-naphthyl)-N-phenylamino]biphenyl (NPB) was deposited to a thickness of 75 nm.
3. A light-emitting layer (LEL) corresponding to a host material I-1, and including light-emitting material D-1 at a level of 0.6% by volume, was deposited to a thickness of 20 nm over the HTL.
4. An electron-transporting layer (ETL) composed of the material I-1 was vacuum-deposited over the LEL. The thickness of the ETL is reported in Table 8a.
5. An electron-injecting layer (EIL), composed of phenanthroline derivative II-2, was deposited over the ETL to a thickness shown in Table 8a.
6. 0.5 nm layer of lithium fluoride was vacuum deposited onto the EIL, followed by a 150 nm layer of aluminum, to form a cathode layer.

The above sequence completed the deposition of the EL device. The device was then hermetically packaged in a dry glove box for protection against ambient environment. The devices were tested in the same manner as device 1-1 and the results are given in Table 8b.

TABLE 8a

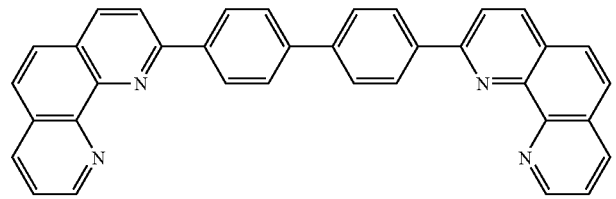

II-2

The LEL, ETL, and EIL of device 7-1 through 7-5.

| Device | Example | LEL Host | LEL Thick. (nm) | ETL Material | ETL Thick. (nm) | EIL Material | EIL Thick. (nm) | EIL/LEL Ratio |
|---|---|---|---|---|---|---|---|---|
| 7-1 | Comparative | I-1 | 20.0 | I-1 | 35.2 | none | none | none |
| 7-2 | Comparative | I-1 | 20.0 | I-1 | 34.0 | II-2 | 1.0 | 0.050 |
| 7-3 | Comparative | I-1 | 20.0 | I-1 | 33.6 | II-2 | 1.5 | 0.075 |
| 7-4 | Inventive | I-1 | 20.0 | I-1 | 32.1 | II-2 | 3.0 | 0.150 |
| 7-5 | Inventive | I-1 | 20.0 | I-1 | 25.1 | II-2 | 10.0 | 0.500 |

TABLE 8b

Testing results for device 7-1 through 7-5.

| Device | Example | Voltage[1] (V) | Luminance Yield (cd/A) | Efficiency (W/A) | Power Efficiency (lm/W) |
|---|---|---|---|---|---|
| 7-1 | Comparative | 7.47 | 0.08 | 0.002 | 0.03 |
| 7-2 | Comparative | 4.89 | 3.25 | 0.081 | 1.69 |
| 7-3 | Comparative | 4.90 | 3.16 | 0.078 | 1.64 |
| 7-4 | Inventive | 3.81 | 5.17 | 0.123 | 3.33 |
| 7-5 | Inventive | 3.65 | 4.95 | 0.119 | 3.26 |

[1]Corrected by subtracting the measured ITO voltage drop.

As illustrated in Table 8b, inventive devices 7-4 and 7-5, using an anthracene electron transport material I-1 in combination with a phenanthroline electron injection material II-2, produce high power efficiency with low voltage relative to the comparative device 7-1 having only an anthracene material. The inventive devices also have an EIL to LEL thickness ratio in a desirable range and perform much better relative to comparison devices 7-2 and 7-3, which have a ratio outside this range.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting Layer (HTL)
109 Light-Emitting layer (LEL)
110 Electron-Transporting layer (ETL)
111 Electron-Injecting layer (EIL)
112 Second Electron-Injecting layer
113 Cathode
150 Power Source
160 Conductor

The invention claimed is:

1. An electroluminescent device comprising
   a cathode, an anode, and having therebetween a light emitting layer (LEL),
     wherein the LEL comprises a dopant and an anthracene host;
   the device further containing an electron transport layer (ETL) comprising an anthracene compound on the cathode side of the LEL, and
   an organic electron injection layer (EIL) between the ETL and the cathode, the EIL comprising a phenanthroline compound,
   wherein the thickness of the EIL and LEL are such that the ratio of the thickness of the EIL to LEL is greater than 0.15, but not greater than 0.75,
   wherein the ETL is disposed adjacent to the LEL, wherein the thickness of the ETL and LEL are such that the ratio of the thickness of the ETL to LEL is at least 0.625, but not greater than 1.63, and
   wherein the phenanthroline compound in the EIL is

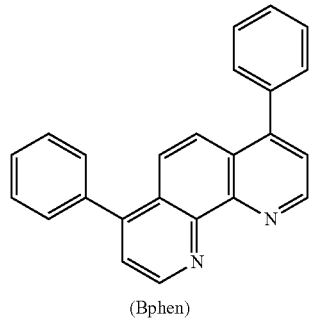 [SMILES: c1ccc(-c2ccnc3c2ccc2c(-c4ccccc4)ccnc23)cc1]

(Bphen)

and wherein the anthracene compound in the ETL is (I-1)

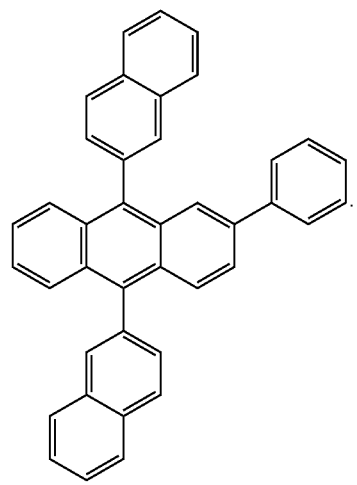

2. An electroluminescent device comprising
   a cathode, an anode, and having therebetween a light emitting layer (LEL),
     wherein the LEL comprises a dopant and an anthracene host;
   the device further containing an electron transport layer (ETL) comprising an anthracene compound on the cathode side of the LEL, and
   an organic electron injection layer (EIL) between the ETL and the cathode, the EIL comprising a phenanthroline compound,
   wherein the thickness of the EIL and LEL are such that the ratio of the thickness of the EIL to LEL is greater than 0.15, but not greater than 0.75,
   wherein the phenanthroline compound in the EIL is

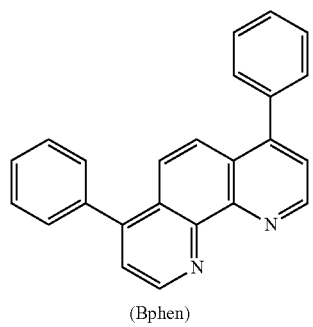 [SMILES: c1ccc(-c2ccnc3c2ccc2c(-c4ccccc4)ccnc23)cc1]

(Bphen)

and wherein the anthracene compound in the ETL is
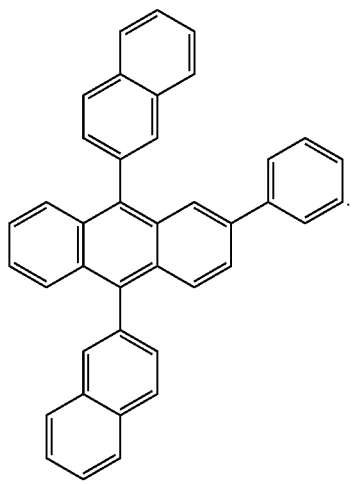
(I-1)
* * * * *